US012666864B2

(12) United States Patent

Hirayama et al.

(10) Patent No.: US 12,666,864 B2

(45) Date of Patent: Jun. 23, 2026

(54) ORGANIC ELECTROLUMINESCENT DEVICE

(71) Applicant: Hodogaya Chemical Co., Ltd., Tokyo (JP)

(72) Inventors: Yuta Hirayama, Tokyo (JP); Eriko Chiba, Tokyo (JP); Kouki Kase, Tokyo (JP); Takeshi Yamamoto, Tokyo (JP); Kazuyuki Suruga, Tokyo (JP)

(73) Assignee: Hodogaya Chemical Co., Ltd., Tokyo (JP)

( * ) Notice: Subject to any disclaimer, the term of this patent is extended or adjusted under 35 U.S.C. 154(b) by 934 days.

(21) Appl. No.: 17/791,279

(22) PCT Filed: Dec. 21, 2020

(86) PCT No.: PCT/JP2020/047680

§ 371 (c)(1),
(2) Date: Jul. 7, 2022

(87) PCT Pub. No.: WO2021/140896

PCT Pub. Date: Jul. 15, 2021

(65) Prior Publication Data

US 2023/0354629 A1      Nov. 2, 2023

(30) Foreign Application Priority Data

Jan. 8, 2020      (JP) ................................. 2020-001564

(51) Int. Cl.
*H10K 85/60*          (2023.01)
*H10K 50/11*          (2023.01)
      (Continued)

(52) U.S. Cl.
CPC ........... *H10K 85/636* (2023.02); *H10K 50/11* (2023.02); *H10K 50/15* (2023.02); *H10K 50/16* (2023.02);
      (Continued)

(58) Field of Classification Search
CPC ........ H10K 50/11; H10K 50/15; H10K 50/16; H10K 50/858; H10K 50/636; H10K 50/654; H10K 50/656; H10K 50/657
See application file for complete search history.

(56) References Cited

U.S. PATENT DOCUMENTS

2013/0193414 A1      8/2013   Werner et al.
2020/0365809 A1      11/2020  Kase et al.
      (Continued)

FOREIGN PATENT DOCUMENTS

CN      104508081 A      4/2015
CN      107078224 A  *  8/2017  ........... C07D 333/76
      (Continued)

OTHER PUBLICATIONS

KR 102059550 B1 English Translation provided by FIT database, translated on Jul. 17, 2025.*
      (Continued)

*Primary Examiner* — Golam Mowla
(74) *Attorney, Agent, or Firm* — Troutman Pepper Locke LLP; James E. Armstrong, IV

(57)      ABSTRACT

The present invention provides an organic electroluminescent device having a capping layer comprising a material having a high absorption coefficient in the wavelength range of 400 nm to 410 nm and no absorption in the respective wavelength ranges of blue, green and red in order to prevent the light in the 400 nm to 410 nm wavelength of sunlight from being absorbed and affecting the materials inside the device and to improve the light extraction efficiency. Since the arylamine compound having a specific structure in the present invention is excellent in stability and durability of the thin film, an organic EL device obtained by selecting amine compounds with high absorbance in the absorption spectrum at concentration $10^{-5}$ mol/L at wavelengths of 400 nm to 410 nm, from amine compounds having a specific
      (Continued)

←——10 CAPPING LAYER
←——9 CATHODE
←——8 ELECTRON INJECTION LAYER
←——7 ELECTRON TRANSPORT LAYER
←——6 LIGHT EMITTING LAYER
←——5 SECOND HOLE TRANSPORT LAYER
←——4 FIRST HOLE TRANSPORT LAYER
←——3 HOLE INJECTION LAYER
←——2 METAL ANODE
←——1 GLASS SUBSTRATE benzoazole ring structure with a high refractive index as a material of a capping layer, exhibits good characteristics.

6 Claims, 13 Drawing Sheets

(51) Int. Cl.
  *H10K 50/15* (2023.01)
  *H10K 50/16* (2023.01)
  *H10K 50/858* (2023.01)

(52) U.S. Cl.
  CPC ......... *H10K 85/656* (2023.02); *H10K 50/858* (2023.02)

(56) References Cited

U.S. PATENT DOCUMENTS

| | | | |
|---|---|---|---|
| 2020/0395549 A1 | 12/2020 | Kase et al. | |
| 2022/0017503 A1 | 1/2022 | Seok et al. | |

FOREIGN PATENT DOCUMENTS

| | | |
|---|---|---|
| CN | 109761967 A | 5/2019 |
| CN | 109824659 A | 5/2019 |
| KR | 10-2013-0114569 A | 10/2013 |
| KR | 10-2046983 B1 | 11/2019 |
| KR | 10-2059550 B1 | 12/2019 |
| WO | 2014009310 A1 | 1/2014 |
| WO | 2019-124550 A1 | 6/2019 |
| WO | 2019/139065 A1 | 7/2019 |
| WO | 2020/027389 A1 | 2/2020 |

OTHER PUBLICATIONS

CN 107078224 A English Translation provided by FIT database, translated on Oct. 29, 2025.*
Office Action dated Jul. 26, 2024, issued for corresponding Taiwanese Patent Application No. 109146391 and English translation thereof.
Supplementary European Search Report mailed Dec. 19, 2023, issued for European Patent Application No. 20912722.4.
Office Action mailed Mar. 17, 2025, issued in the corresponding Korean Patent Application No. 10-2022-7022229.

* cited by examiner

[Figure 2]
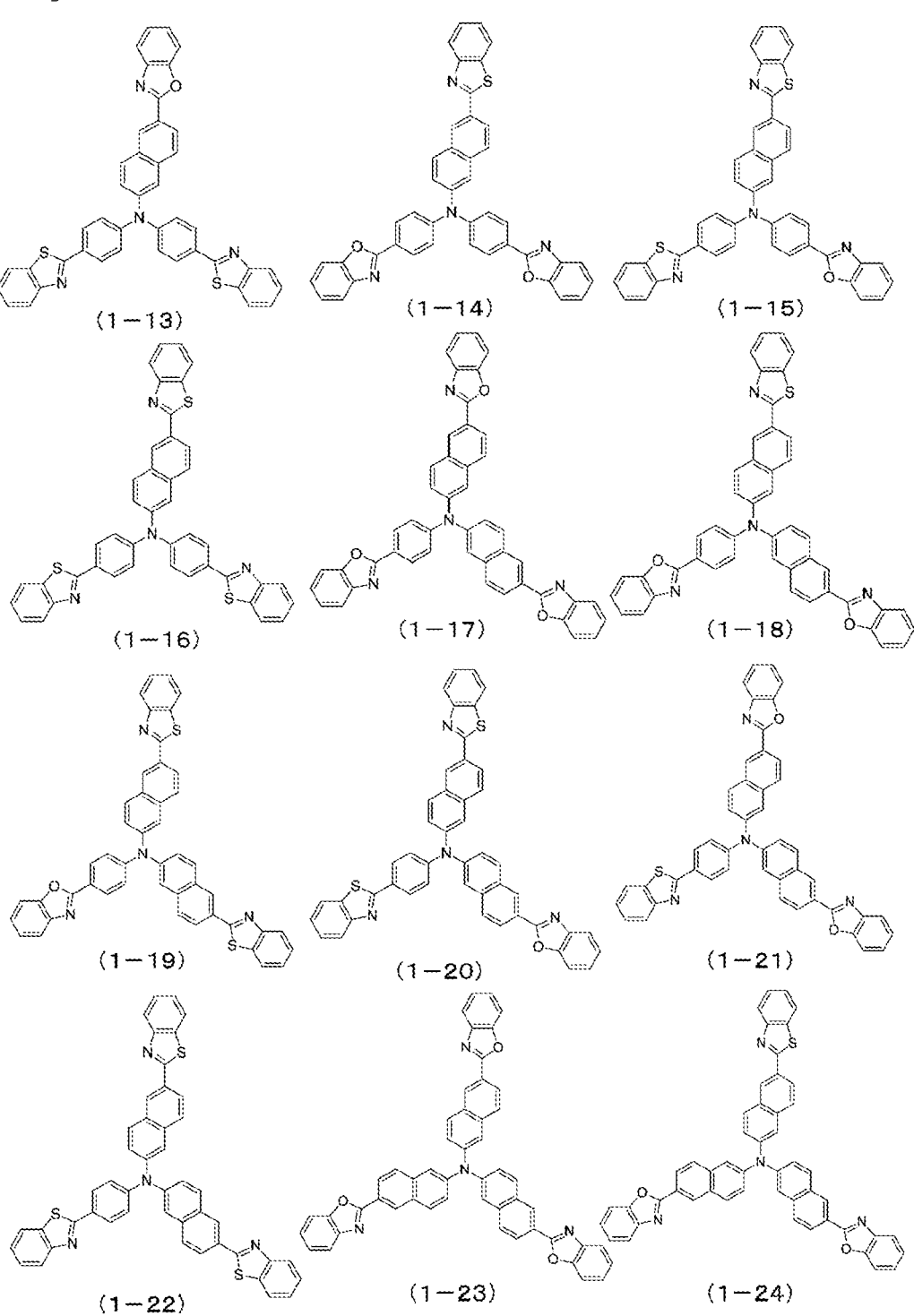
(1-13)        (1-14)        (1-15)
(1-16)        (1-17)        (1-18)
(1-19)        (1-20)        (1-21)
(1-22)        (1-23)        (1-24)

[Figure 10]
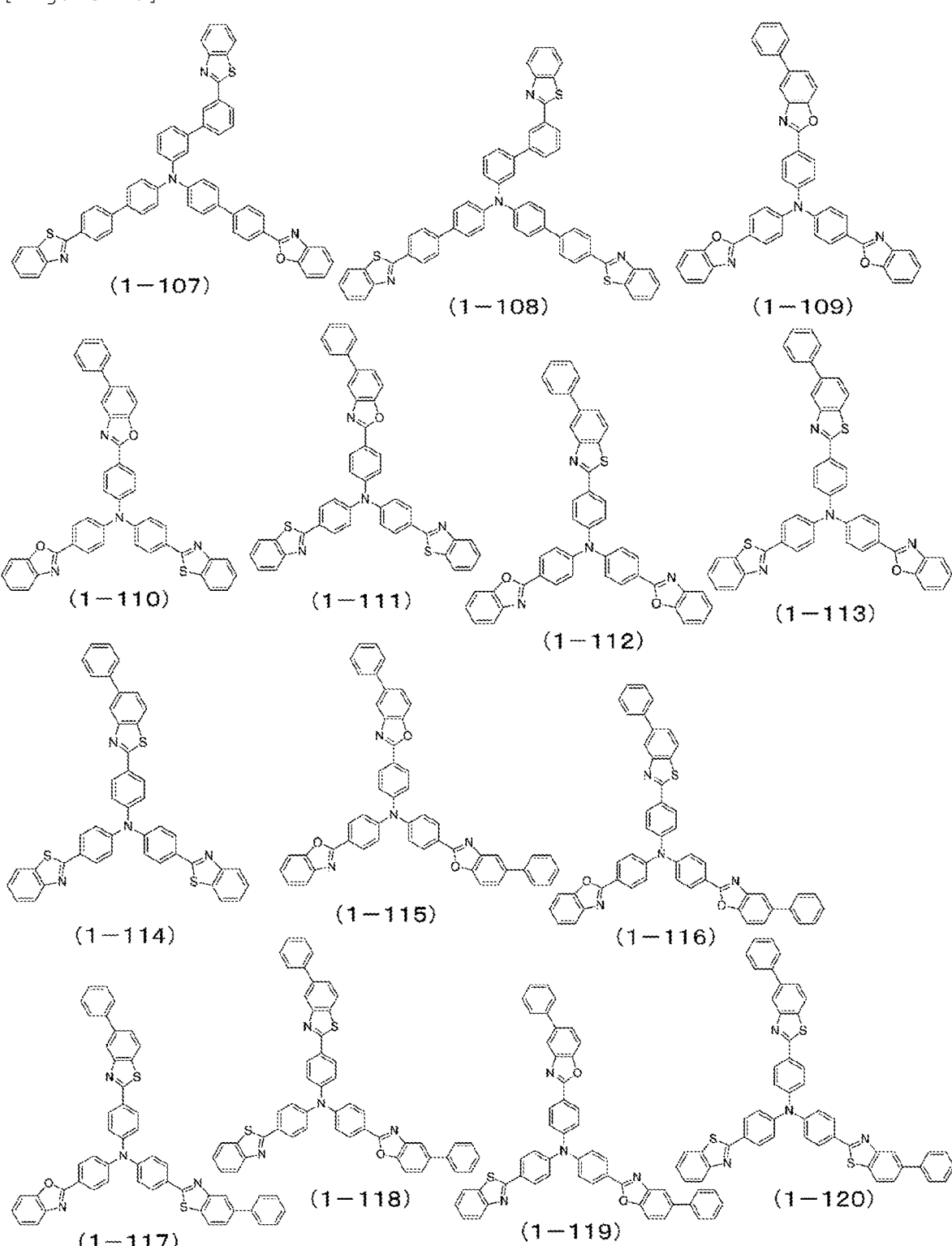
(1-107)
(1-108)
(1-109)
(1-110)
(1-111)
(1-112)
(1-113)
(1-114)
(1-115)
(1-116)
(1-117)
(1-118)
(1-119)
(1-120)

[Figure 13]
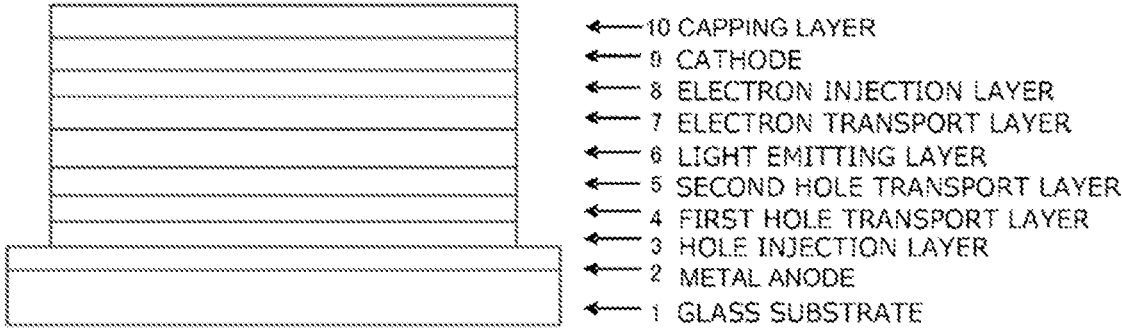
- 10 CAPPING LAYER
- 9 CATHODE
- 8 ELECTRON INJECTION LAYER
- 7 ELECTRON TRANSPORT LAYER
- 6 LIGHT EMITTING LAYER
- 5 SECOND HOLE TRANSPORT LAYER
- 4 FIRST HOLE TRANSPORT LAYER
- 3 HOLE INJECTION LAYER
- 2 METAL ANODE
- 1 GLASS SUBSTRATE

ORGANIC ELECTROLUMINESCENT DEVICE

TECHNICAL FIELD

The present invention relates to compounds suitable for an organic electroluminescent device (hereinafter referred to as organic EL device), which is a preferred self-luminous device for various display devices. Specifically, this invention relates to amine compounds having a benzoazole ring structure and organic EL devices using such compounds.

BACKGROUND ART

The organic EL device is a self-luminous device and has been actively studied for their brighter, superior visibility and the ability to display clearer images in comparison with liquid crystal devices.

In 1987, C. W. Tang and colleagues at Eastman Kodak developed a laminated structure device using materials assigned with different roles, realizing practical applications of an organic EL device with organic materials. These researchers laminated an electron-transporting phosphor and a hole-transporting organic substance and injected both charges into a phosphor layer to cause emission in order to obtain a high luminance of 1,000 cd/m² or more at a voltage of 10 V or less (refer to Patent Documents 1 and 2, for example).

To date, many improvements have been made for the practical application of organic EL devices. Various roles of the laminated structure have been further subdivided to provide a light emitting device that includes an anode, a hole injection layer, a hole transport layer, a light emitting layer, an electron transport layer, an electron injection layer, and a cathode sequentially on a substrate. In this light emitting device, efficiency and durability have come to be achieved by providing thereto a bottom emission structure that emits light from the bottom (refer to non-patent document 1, for example).

Recently, a light emitting device with a top emission structure in which a metal having a high work function is used for an anode and light is emitted from the top is coming into use. In a light emitting device with a bottom-emission structure where light is taken out from the bottom having a pixel circuit, the area of the light emitting portion is limited, whereas in a light-emitting devices with a top-emission structure have the advantage that the light is taken out from the top and is not blocked by the pixel circuit, thus allowing a larger emission area. In the light emitting device with a top emission structure, semitranslucent electrodes made of LiF/Al/Ag (refer to Non-Patent Literature 2, for example), Ca/Mg (refer to Non-Patent Literature 3, for example), LiF/MgAg, or the like are used for a cathode.

In such light emitting device, when light that is emitted by a light emitting layer and incident on another layer is incident at a certain angle or more, the light is totally reflected at an interface between the light emitting layer and the other layer. Thus, light that can be used has been limited to only a part of the emitted light. Recently, a light emitting device has been proposed in which a "capping layer" with a high refractive index is provided on the outside of a semi-translucent electrode with a low refractive index, in order to improve the light extraction efficiency (refer to Non-Patent Literatures 2 and 3, for example).

Regarding the effect of the capping layer in a light emitting device with a top emission structure, while a light emitting device using Ir(ppy3)3 as a light emitting material has a current efficiency of 38 cd/A in the case of not having a capping layer, the light emitting device has a current efficiency of 64 cd/A, in the case of using a ZnSe film with a thickness of 60 nm as a capping layer, which indicates that the efficiency is improved about 1.7 times. Furthermore, it is indicated that the maximum point of transmittance of the translucent electrode and capping layer does not necessarily coincide with the maximum point of efficiency, and that the maximum point of light extraction efficiency is determined by interference effects (refer to Non-Patent Document 3, for example).

In the past, it has been proposed to use a metal mask with a high degree of definition to form the capping layer, but there is a problem that the metal mask is distorted by heat when used under high temperature conditions, resulting in a decrease in alignment accuracy. Therefore, ZnSe has a high melting point of 1100° C. or higher (refer to, Non-Patent Document 3, for example), and a highly detailed metal mask cannot be used to deposit ZnSe at precise positions, which may affect the light emitting devices themselves. Furthermore, even deposition by the sputtering method affects the light emitting devices, inorganic materials are not suitable for use as components of the capping layer.

In addition, when tris(8-hydroxyquinoline) aluminum (hereinafter abbreviated as Alq₃) is used as a capping layer to adjust the refractive index (refer to Non-Patent Document 2, for example), Alq₃ is known as an organic EL material commonly used as a green emitting material or electron transport material, it has a weak absorption around 450 nm, which is used for blue emitting materials, and has the problems of reducing the color purity and light extraction efficiency of blue emitting devices.

In addition, the devices fabricated with conventional capping layers allow light of 400 nm to 410 nm wavelength of sunlight to pass through, affecting the materials inside the devices and resulting in a decrease in color purity and light extraction efficiency.

In order to improve the device characteristics of organic EL device, especially to absorb light at a wavelength of 400 nm to 410 nm of sunlight, not to affect the materials inside the device, and to significantly improve the light extraction efficiency, materials with high absorption coefficient, high refractive index, and excellent thin film stability and durability are required as capping layer materials.

CITATION LIST

Patent Documents

Patent Document 1: JP-A-Hei-8-048656
Patent Document 2: Japanese Patent No. 3194657
Patent Document 3: WO2014/009310
Patent Document 4: WO2013/038627

Non-Patent Documents

Non-Patent Document 1: The Japan Society of Applied Physics, 9th Lecture Preprints, pp. 55 to 61 (2001)
Non-Patent Document 2: Appl. Phys. Let., 78, 544 (2001)
Non-Patent Document 3: Appl. Phys. Let., 82, 466 (2003)
Non-Patent Document 4: J. Org. Chem., 71, 1802 (2006)
Non-Patent Document 5: J. Org. Chem., 60, 7508 (1995)
Non-Patent Document 6: Synth. Commun., 11, 513 (1981)
Non-Patent Document 7: Appl. Phys. Lett., 98, 083302 (2011)

SUMMARY OF THE INVENTION

Technical Problem

An object of the present invention is to improve the device characteristics of an organic EL device, in particular, not to affect the materials inside the device by absorbing light at a wavelength of 400 nm to 410 nm of sunlight, and to greatly improve light extraction efficiency. To this end, it is to provide an organic EL device having a capping layer comprising a material having (1) high absorption coefficient at a wavelength of 400 nm to 410 nm, (2) high refractive index, (3) good thin film stability, (4) excellent durability, (5) excellent light resistance, (6) no absorption in the blue, green, and red wavelength regions, respectively.

Physical properties of the material of the capping layer suitable for the present invention include (1) high absorption coefficient at a wavelength of 400 nm to 410 nm, (2) high refractive index, (3) vapor-deposit ability, (4) good thin film stability, and (5) high glass transition point. Physical properties of the organic EL device of the present invention include (1) high absorption of light with a wavelength of 400 nm to 410 nm, (2) high light extraction efficiency, (3) no loss in color purity, (4) light transmission without changes over time, and (5) a long lifetime.

Solution to Problem

For achieving the object, the present inventors focused on the fact that arylamine-based materials have excellent thin film stability and durability, and from an amine compound having a specific benzoxazole ring structure with a high refractive index, an amine compound having high absorbance in the absorption spectrum with a concentration of $10^{-5}$ mol/L at a wavelength of 400 nm to 410 nm was selected, and fabricated organic EL devices using the compounds as the materials constituting the capping layer of the devices, and thoroughly evaluated the properties of the devices, as a result of which the present invention was accomplished.

Specifically, according to the present invention, the following organic EL devices are provided.

1) An organic EL device comprising at least an anode electrode, a hole transport layer, an emission layer, an electron transport layer, a cathode electrode, and a capping layer, in this order, wherein a refractive index of the capping layer is 1.90 or higher at a wavelength of from 500 nm to 570 nm and, wherein the device contains an amine compound having a benzoazole ring structure represented by the following general formula (1):

[Chemical Formula 1]

(1)

In the formula, $R_1$ to $R_3$ may be the same or different, and represent a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and when more than one of these groups are bonded to the same benzene ring, they may be bonded to each other to form a ring, or each group may be bonded to the benzene ring to which it is bonded to form a ring. X, Y, and Z may be the same or different, and represent an oxygen atom or a sulfur atom, and $Ar_1$ to $Ar_3$ may be the same or different and represents a divalent group of a substituted or unsubstituted aromatic hydrocarbon, a divalent group of a substituted or unsubstituted aromatic heterocyclic ring, or a divalent group of substituted or unsubstituted condensed polycyclic aromatics. $r_1$ to $r_3$ may be the same or different and represent integers from 0 to 4.

2) The organic EL device of 1), wherein the amine compound having the benzoazole ring structure is represented by the following general formula (1a):

[Chemical Formula 2]

(1a)

In the formula, $R_1$ to $R_3$, X, Y, and Z, $r_1$ to $r_3$ represent as defined by the general formula (1).

3) The organic EL device of 1) or 2), wherein all $r_1$ to $r_3$ in the general formula (1) or the general formula (1a) represents 0.

4) The organic EL device of 1), wherein the thickness of the capping layer is within a range of 30 nm to 120 nm.

5) The organic EL device of 1) or 2), wherein all X, Y, and Z in the general formula (1) or the general formula (1a) represents oxygen atoms.

6) The organic EL device of 1) or 2), wherein any two of X, Y, and Z in the general formula (1) or the general formula (1a) represents oxygen atoms.

7) The organic EL device of 1) or 2), wherein any one of X, Y, and Z in the general formula (1) or the general formula (1a) represents an oxygen atom.

8) The organic EL device of 1) or 2), wherein all X, Y, and Z in the general formula (1) or the general formula (1a) represents sulfur atoms.

9) The organic EL device of 1), wherein all $Ar_1$, $Ar_2$, and $Ar_3$ in the general formula (1) represents a divalent group of a substituted or unsubstituted aromatic hydrocarbon.

10) The organic EL device of 1), wherein any two of $Ar_1$, $Ar_2$, and $Ar_3$ in the general formula (1) represents a divalent group of a substituted or unsubstituted aromatic hydrocarbon.

11) The organic EL device of 1), wherein any one of $Ar_1$, $Ar_2$, and $Ar_3$ in the general formula (1) represents a divalent group of a substituted or unsubstituted aromatic hydrocarbon.

12) The organic EL device of 1), wherein all $Ar_1$, $Ar_2$, and $Ar_3$ in the general formula (1) represents a divalent group of a substituted or unsubstituted aromatic hydrocarbon.

13) The organic EL device of 1), wherein all $Ar_1$, $Ar_2$, and $Ar_3$ in the general formula (1) represents a divalent group of substituted or unsubstituted condensed polycyclic aromatics.

14) A method for using an amine compound having a refractive index of 1.90 or higher at a wavelength of 500 nm to 570 nm and having a benzoazole ring structure represented by the following general formula (1) or the following general formula (1a) in the capping layer of an organic electroluminescent device:

[Chemical Formula 3]

(1)

In the formula, $R_1$ to $R_3$ may be the same or different, and represent a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and when more than one of these groups are bonded to the same benzene ring, they may be bonded to each other to form a ring, or each group may be bonded to the benzene ring to which it is bonded to form a ring. X, Y, and Z may be the same or different, and represent an oxygen atom or a sulfur atom, and $Ar_1$ to $Ar_3$ may be the same or different and represents a divalent group of a substituted or unsubstituted aromatic hydrocarbon, a divalent group of a substituted or unsubstituted aromatic heterocyclic ring, or a divalent group of substituted or unsubstituted condensed polycyclic aromatics. $r_1$ to $r_3$ may be the same or different and represent integers from 0 to 4.

[Chemical Formula 4]

(1a)

In the formula, $R_1$ to $R_3$, X, Y, and Z, $r_1$ to $r_3$ represent as defined by the general formula (1).

Specific examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_1$ to $R_3$ in the general formula (1) or (1a) include phenyl, biphenyl, terphenyl, naphthyl, anthracenyl, phenanthrenyl, fluorenyl, spirobifluorenyl, indenyl, pyrenyl, perylenyl, fluoranthenyl, triphenylenyl, pyridyl, pyrimidinyl, triazinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, naphthyridinyl, phenanthrolinyl, acridinyl, and carbolinyl or the like, and an aryl group consisting of 6 to 30 carbon atoms, or a heteroaryl group consisting of 2 to 20 carbon atoms can be selected.

When more than one of these groups is bonded to the same benzene ring, they may be bonded to each other via a single bond, a substituted or unsubstituted methylene group, an oxygen atom or a sulfur atom to form a ring, or they may be bonded to the benzene ring to which each group is attached via a single bond, a substituted or unsubstituted methylene group, an oxygen atom or a sulfur atom to form a ring.

Specific examples of the "linear or branched alkyl group of 1 to 6 carbon atoms", the "cycloalkyl group of 5 to 10 carbon atoms", the "linear or branched alkenyl group of 2 to 6 carbon atoms", the "linear or branched alkyloxy group of 2 to 6 carbon atoms", the "cycloalkyloxy group of 5 to 10 carbon atoms" or the "aryloxy group" in the "linear or branched alkyl group of 1 to 6 carbon atoms that may have a substituent", the "cycloalkyl group of 5 to 10 carbon atoms that may have a substituent", the "linear or branched alkenyl group of 2 to 6 carbon atoms that may have a substituent", the "linear or branched alkyloxy group of 1 to 6 carbon atoms that may have a substituent", the "cycloalkyloxy group of 5 to 10 carbon atoms that may have a substituent" or the "substituted or unsubstituted aryloxy group" represented by $R_1$ to $R_3$ in the general formula (1) or (1a) include a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, a 2-butenyl group, a methyloxy group, an ethyloxy group, an n-propyloxy group, cyclopentyloxy group, cyclohexyloxy group, 1-adamantyloxy group, phenyloxy group, tolyloxy group, and biphenyloxy group.

When more than one of these groups is bonded to the same benzene ring, they may be bonded to each other via a single bond, a substituted or unsubstituted methylene group, an oxygen atom or a sulfur atom to form a ring, or they may be bonded to the benzene ring to which each group is attached via a single bond, a substituted or unsubstituted methylene group, an oxygen atom or a sulfur atom to form a ring.

Specific examples of the "substituent" in the "substituted aromatic hydrocarbon group", the "substituted aromatic heterocyclic group", the "substituted condensed polycyclic aromatic group", the "linear or branched alkyl group of 1 to 6 carbon atoms having a substituent", the "cycloalkyl group of 5 to 10 carbon atoms having a substituent", the "linear or branched alkenyl group of 2 to 6 carbon atoms having a substituent", the "linear or branched alkyloxy group of 1 to 6 carbon atoms having a substituent", the "cycloalkyloxy group of 5 to 10 carbon atoms having a substituent" or the "substituted aryloxy group" represented by $R_1$ to $R_3$ in general formula (1) or (1a) include a deuterium atom; cyano; nitro; halogen atoms such as a fluorine atom, a chlorine atom, a bromine atom, and an iodine atom; silyl group such as trimethylsilyl and triphenylsilyl; linear or branched alkyl group of 1 to 6 carbon atoms such as methyl, ethyl, and propyl; linear or branched alkyloxy group of 1 to 6 carbon atoms such as methyloxy, ethyloxy, and propyloxy; alkenyl group such as vinyl and allyl; aryloxy group such as phenyloxy and tolyloxy; arylalkyloxy group such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, spirobifluorenyl, indenyl, pyrenyl, perylenyl, fluoranthenyl, and triphenylenyl; aromatic heterocyclic groups such as pyridyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, carbolinyl; an aryl group consisting of 6 to 30 carbon atoms, or a heteroaryl group consisting of 2 to 20 carbon atoms. These substituents may be further substituted with the exemplified substituents above.

These substituents may bind to each other via a single bond, substituted or unsubstituted methylene, an oxygen atom, or a sulfur atom to form a ring.

Specific examples of the "aromatic hydrocarbon", the "aromatic heterocyclic ring", or the "condensed polycyclic aromatics" of the "substituted or unsubstituted aromatic hydrocarbon", the "substituted or unsubstituted aromatic heterocyclic ring", or the "substituted or unsubstituted condensed polycyclic aromatics" in the "divalent group of a substituted or unsubstituted aromatic hydrocarbon", the "divalent group of a substituted or unsubstituted aromatic heterocyclic ring", or the "divalent group of substituted or unsubstituted condensed polycyclic aromatics" represented by $Ar_1$ to $Ar_3$ in the in general formula (1) or (1a) include benzene, biphenyl, terphenyl, tetrakisphenyl, styrene, naphthalene, anthracene, acenaphthalene, fluorene, phenanthrene, indane, pyrene, triphenylene, pyridine, pyrimidine, triazine pyrrole, furan, thiophene, quinoline, isoquinoline, benzofuran, benzothiophene, indoline, carbazole, carboline, benzoxazole, benzothiazole, quinoxaline, benzoimidazole, pyrazole, dibenzofuran, dibenzothiophene, naphthyridine, phenanthroline, and acridine.

The "divalent group of a substituted or unsubstituted aromatic hydrocarbon", the "divalent group of a substituted or unsubstituted aromatic heterocyclic ring", or the "divalent group of substituted or unsubstituted condensed polycyclic aromatics" represented by $Ar_1$ to $Ar_3$ in general formula (1) is a divalent group that results from the removal of two hydrogen atoms from the above "aromatic hydrocarbon", "aromatic heterocyclic ring", or "condensed polycyclic aromatics". These divalent groups may have a substituents, and examples of the substituent include the same substituents exemplified as the "substituents" that the "substituted aromatic hydrocarbons group", the "substituted aromatic heterocyclic group" the "substituted condensed polycyclic aromatic group", the "linear or branched alkyl group of 1 to 6 carbon atoms having a substituent", the "cycloalkyl group of 5 to 10 carbon atoms having a substituent", "linear or branched alkenyl group of 2 to 6 carbon atoms having a substituent", "linear or branched alkyloxy group of 1 to 6 carbon atoms having a substituent", the "cycloalkyloxy group of 5 to 10 carbon atoms having a substituent" represented by $R_1$ to $R_3$ in the general formula (1) or (1a) may have. These substituents may be bonded to each other via a single bond, substituted or unsubstituted methylene group, an oxygen atom, or a sulfur atom to form a ring.

In general formula (1) or (1a), $r_1$ to $r_3$ may be the same or different, and represent integers from 0 to 4, and it is preferred that they are 0 to 2, and it is more preferred that they are 0 to 1. And it is further preferred that all $r_1$ to $r_3$ are 0 (i.e., unsubstituted).

In general formula (1) or (1a), X, Y, and Z may be the same or different, and represent an oxygen atom or a sulfur atom. It is preferred that any one or more of X, Y, and Z is a sulfur atom.

In the general formula (1), $Ar_1$ to $Ar_3$ are preferably the "divalent group of a substituted or unsubstituted aromatic hydrocarbon", far preferably, a "divalent group that results from the removal of two hydrogen atoms from benzene" (i.e., phenylene). And particularly preferably all $Ar_1$ to $Ar_3$ are a "divalent group that results from the removal of two hydrogen atoms from benzene" (i.e., phenylene).

In the organic EL device of the present invention, the thickness of the capping layer is preferably within a range of 30 nm to 120 nm, and more preferably within a range of 40 nm to 80 nm.

In the organic EL device of the present invention, at a wavelength of from 500 nm to 570 nm of light transmitted through the capping layer, it is preferably that the refractive index of the capping layer is 1.90 or higher and far preferably that the refractive index is 2.00 or higher.

In the organic EL device of the present invention, the capping layer may be made by stacking or mixing two or more different constituent materials.

Effects of the Invention

The organic EL device of the present invention has a capping layer with a higher refractive index than that of the semi-transparent electrode, which is provided outside the transparent or semi-transparent electrode, making it possible to obtain an organic EL device that can significantly improve the light extraction efficiency. In addition, by using an amine compound having a benzoazole ring structure represented by the aforementioned general formula (1) or (1a) in the capping layer, the film can be formed at a temperature of 400°

C. or lower, so that it is possible to optimize the light extraction efficiency of each color using a high-definition mask without damaging the light-emitting elements, and it is also suitable for applying full-color displays, enabling the display of clear and bright images with good color purity.

As the organic EL device of the present invention uses the capping layer material with a high light absorption coefficient at wavelength of 400 nm to 410 nm, a high refractive index, and excellent thin film stability, durability and light resistance, it enables the device to maintain color purity and significantly improve light extraction efficiency compared to conventional organic EL devices, without being affected by sunlight. Furthermore, it is now possible to realize organic EL device with high efficiency and long life.

BRIEF DESCRIPTION OF THE DRAWINGS

Figure 1:
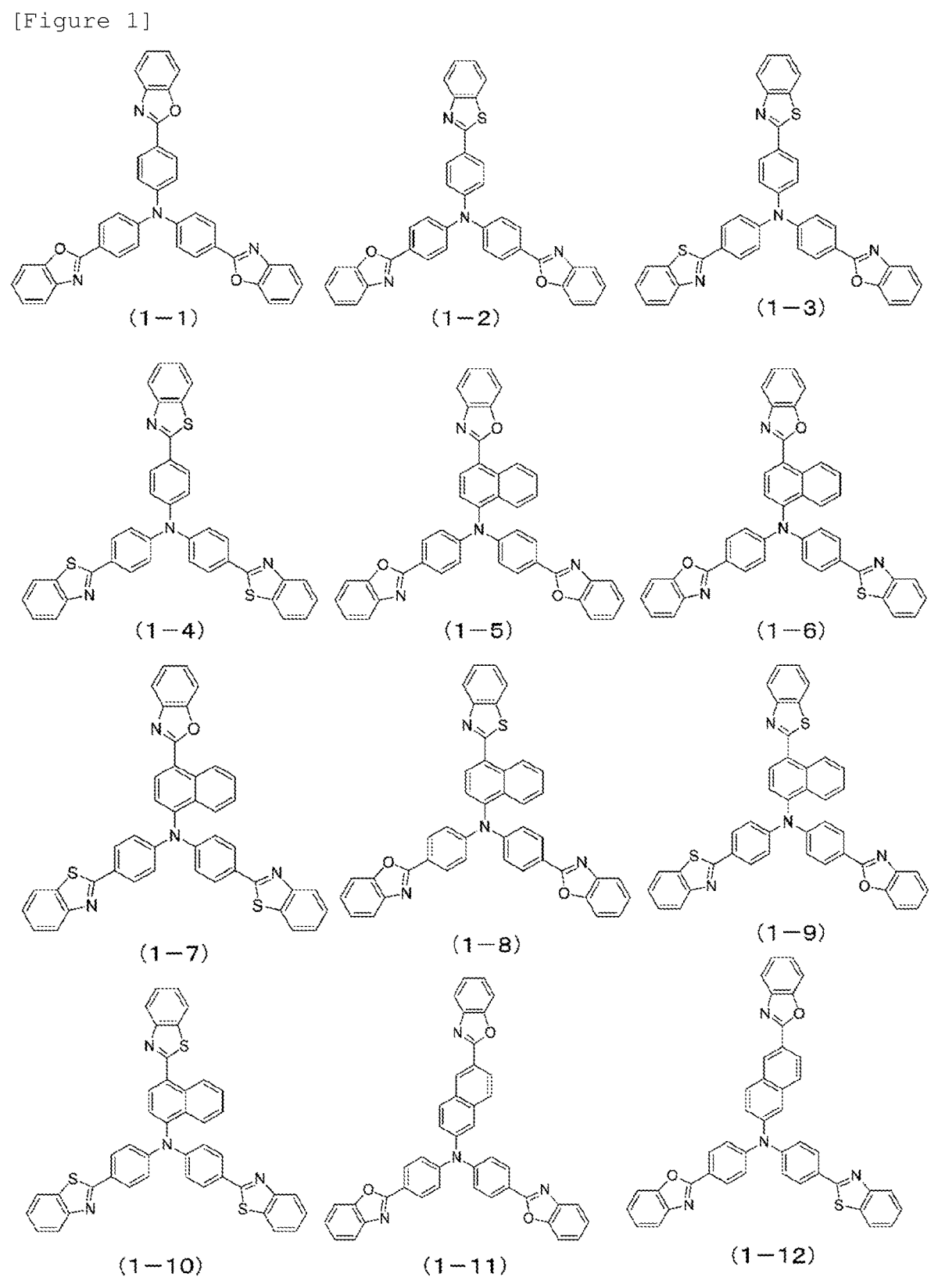

FIG. 1 is a figure showing the structures of compounds (1-1) through (1-12) as amine compounds having the benzoazole ring structure represented by the general formula (1).

FIG. 2 is a figure showing the structures of compounds (1-13) to (1-24) as amine compounds having the benzoazole ring structure represented by the general formula (1).

Figure 3:
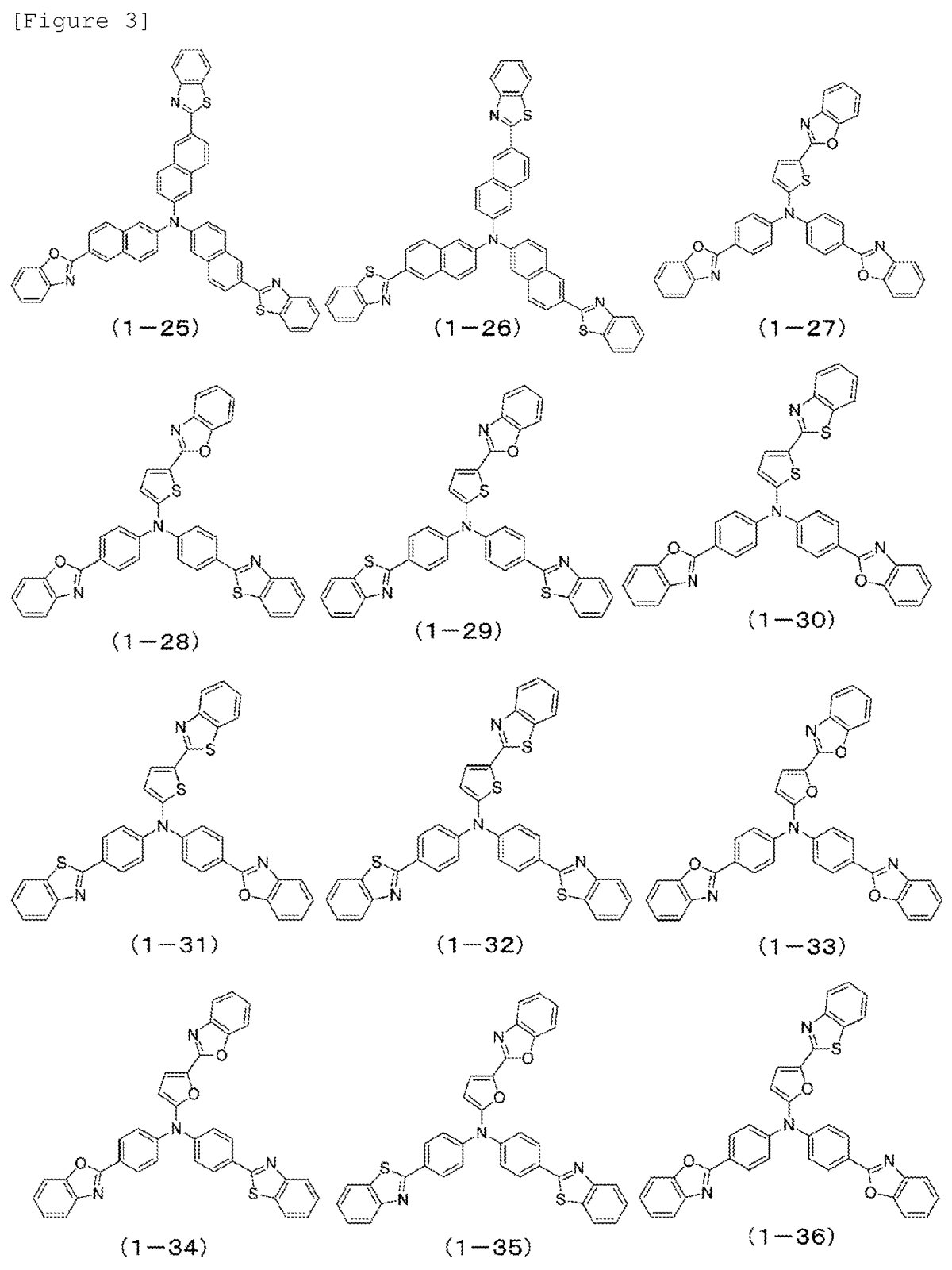

FIG. 3 is a figure showing the structures of compounds (1-25) to (1-36) as amine compounds having the benzoazole ring structure represented by the general formula (1).

Figure 4:
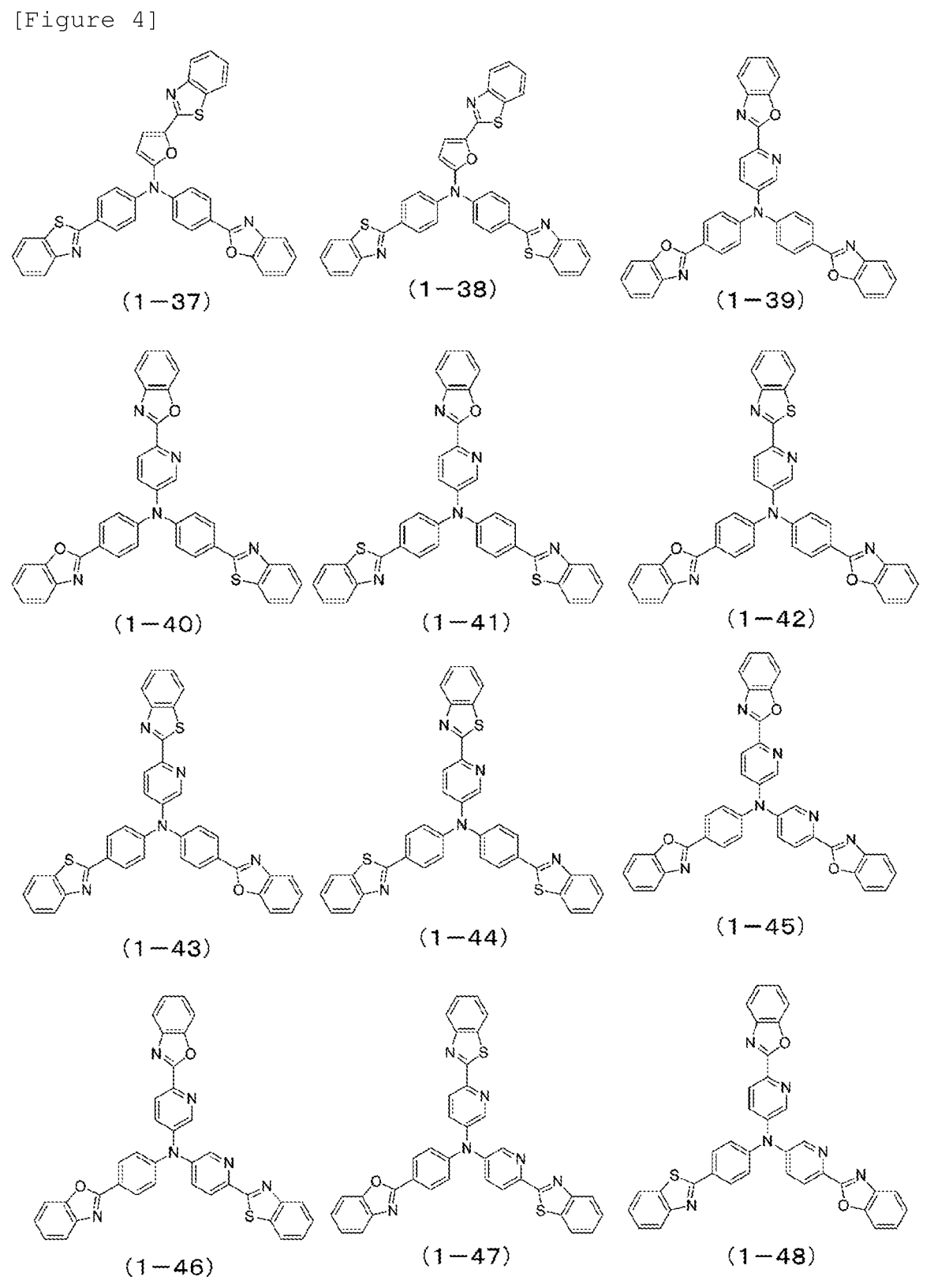

FIG. 4 is a figure showing the structures of compounds (1-37) to (1-48) as amine compounds having the benzoazole ring structure represented by the general formula (1).

Figure 5:
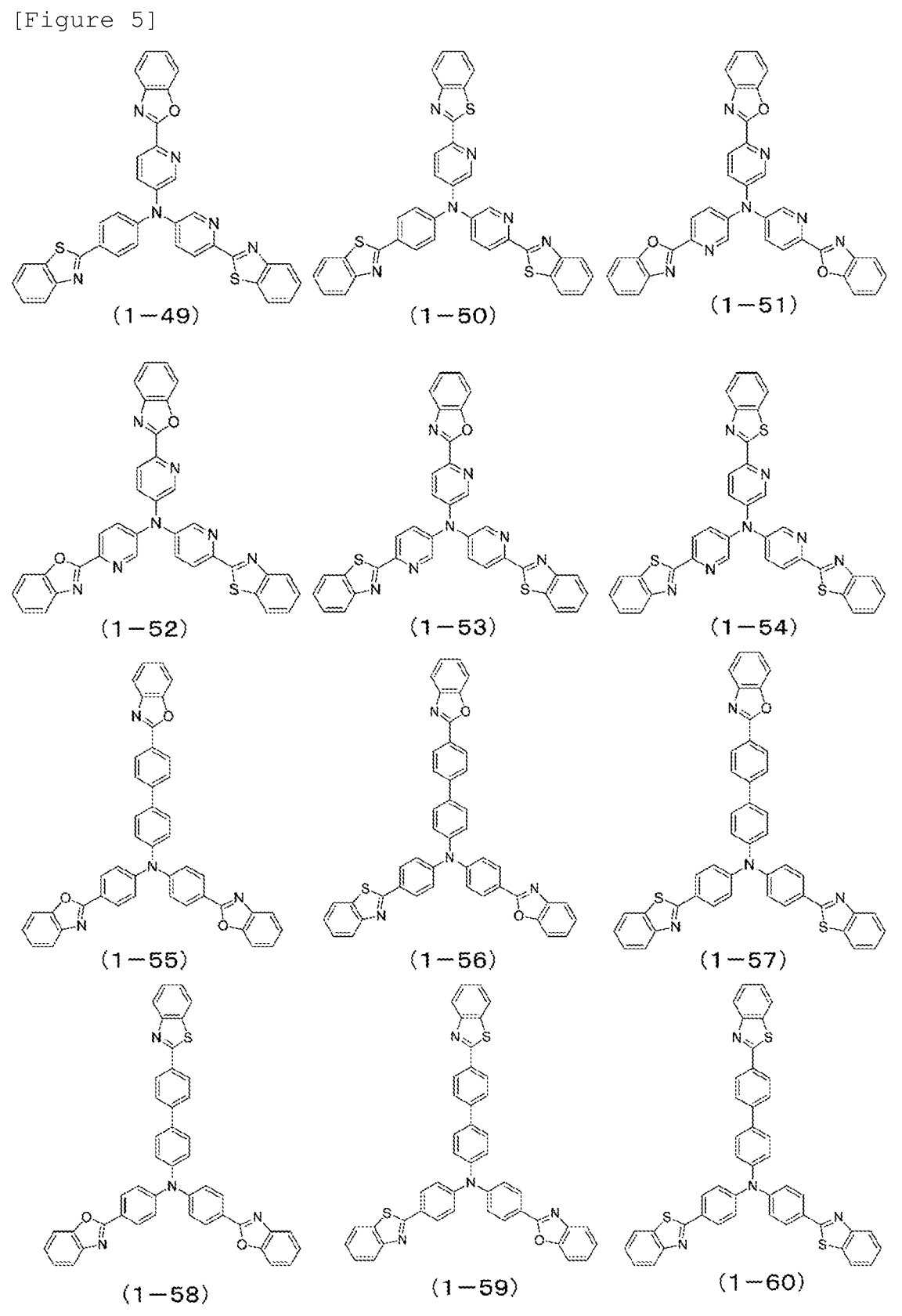

FIG. 5 is a figure showing the structures of compounds (1-49) to (1-60) as amine compounds having the benzoazole ring structure represented by the general formula (1).

Figure 6:
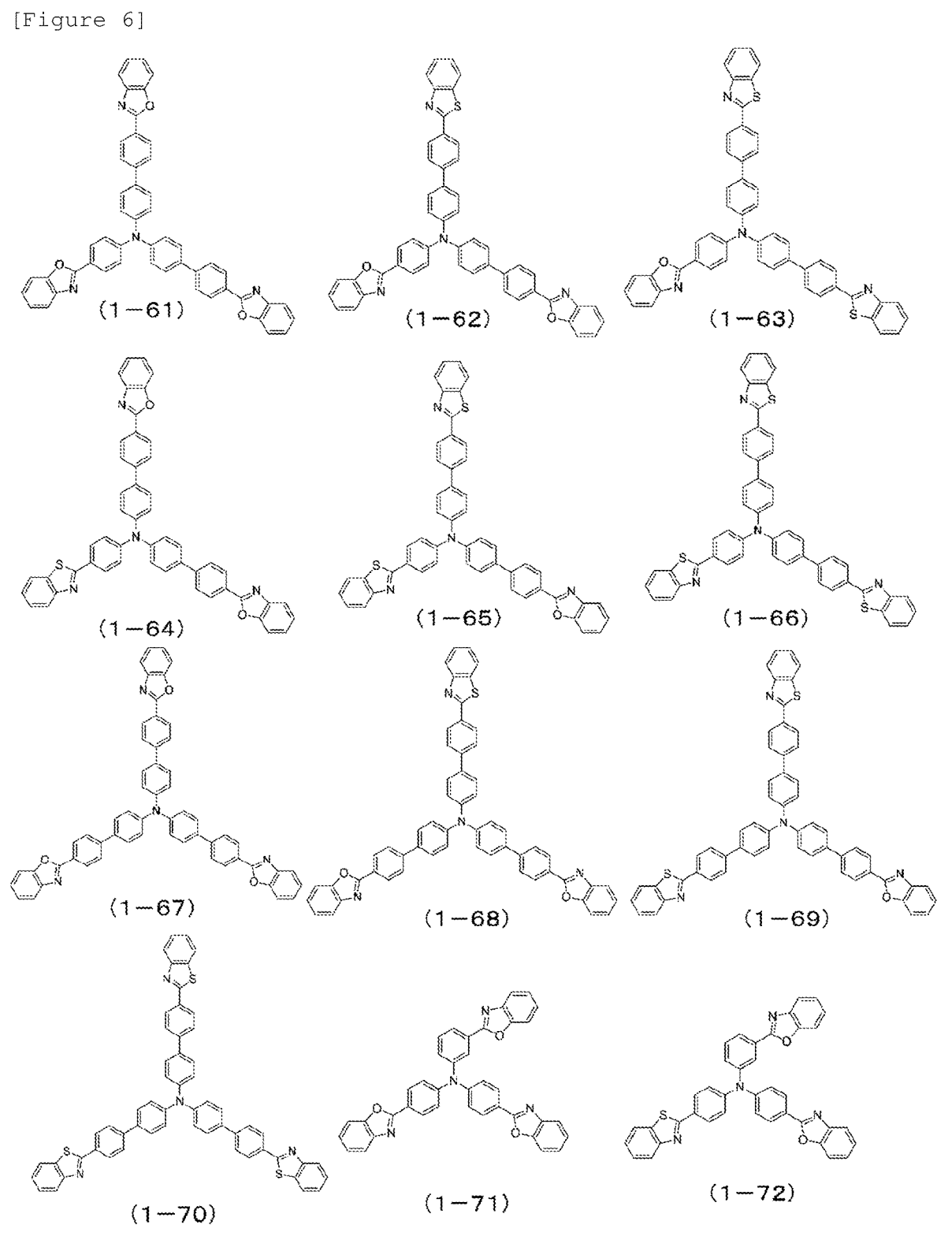

FIG. 6 is a figure showing the structures of compounds (1-61) to (1-72) as amine compounds having the benzoazole ring structure represented by the general formula (1).

Figure 7:
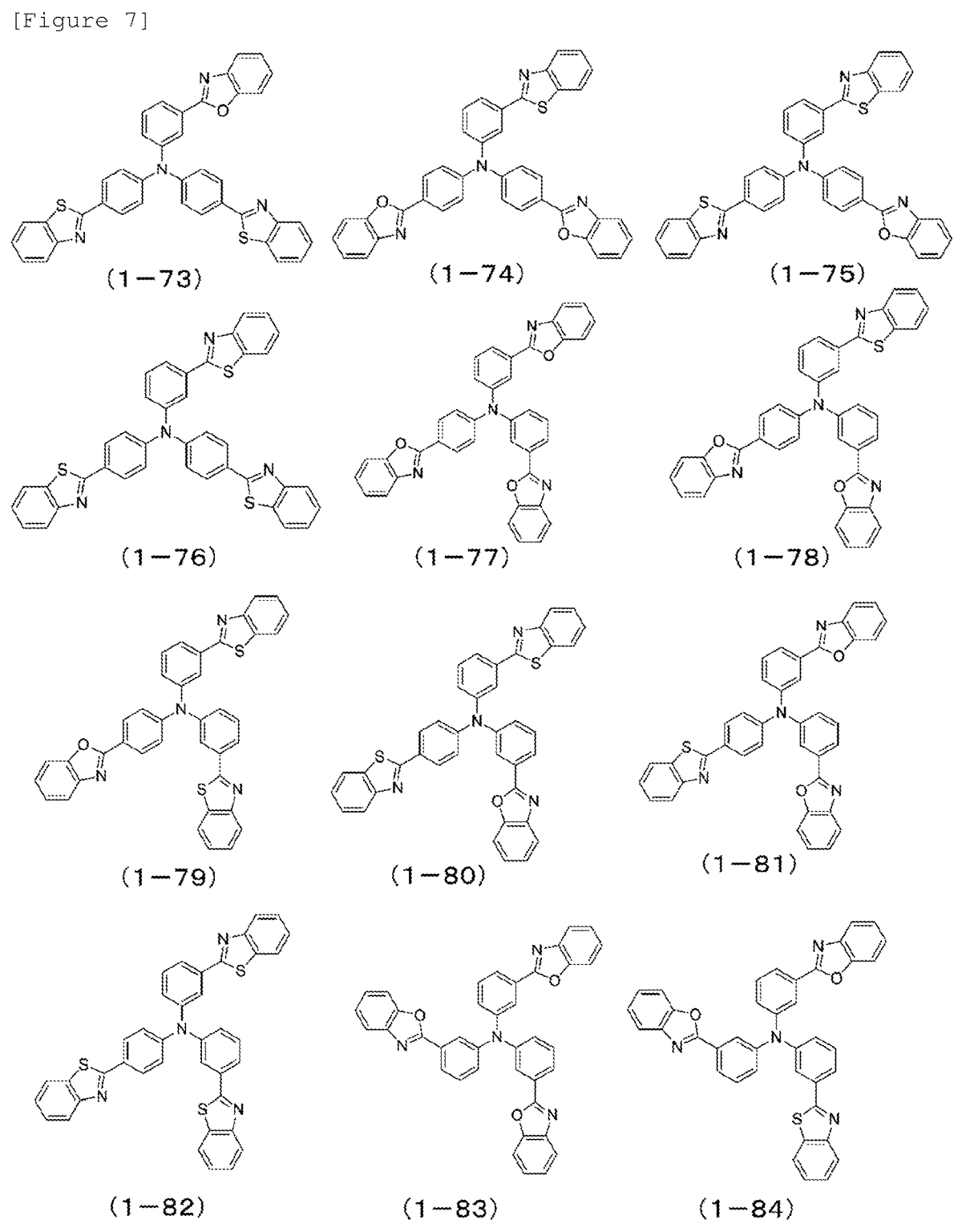

FIG. 7 is a figure showing the structures of compounds (1-73) to (1-84) as amine compounds having the benzoazole ring structure represented by the general formula (1).

Figure 8:
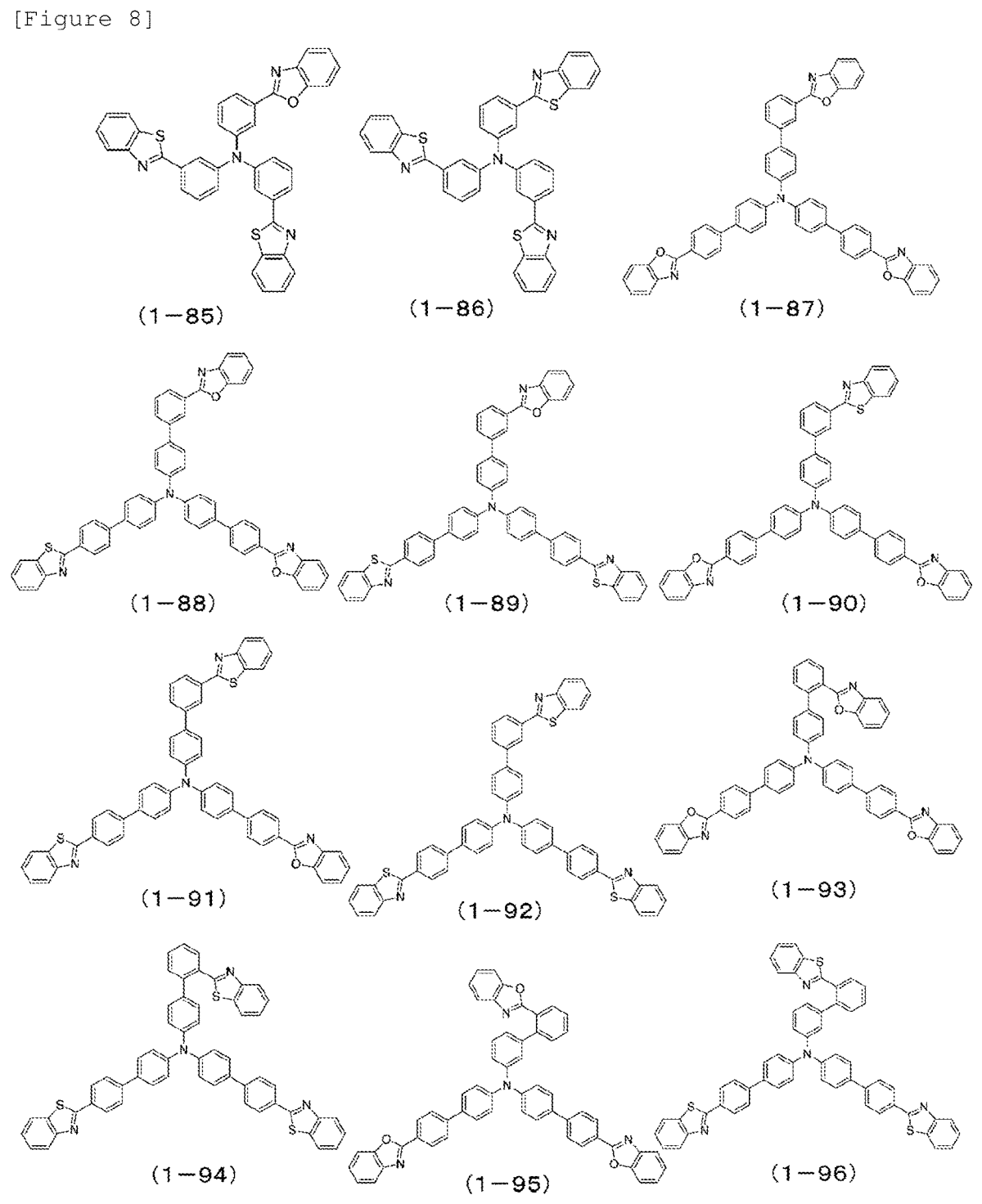

FIG. 8 is a figure showing the structures of compounds (1-85) to (1-96) as amine compounds having the benzoazole ring structure represented by the general formula (1).

Figure 9:
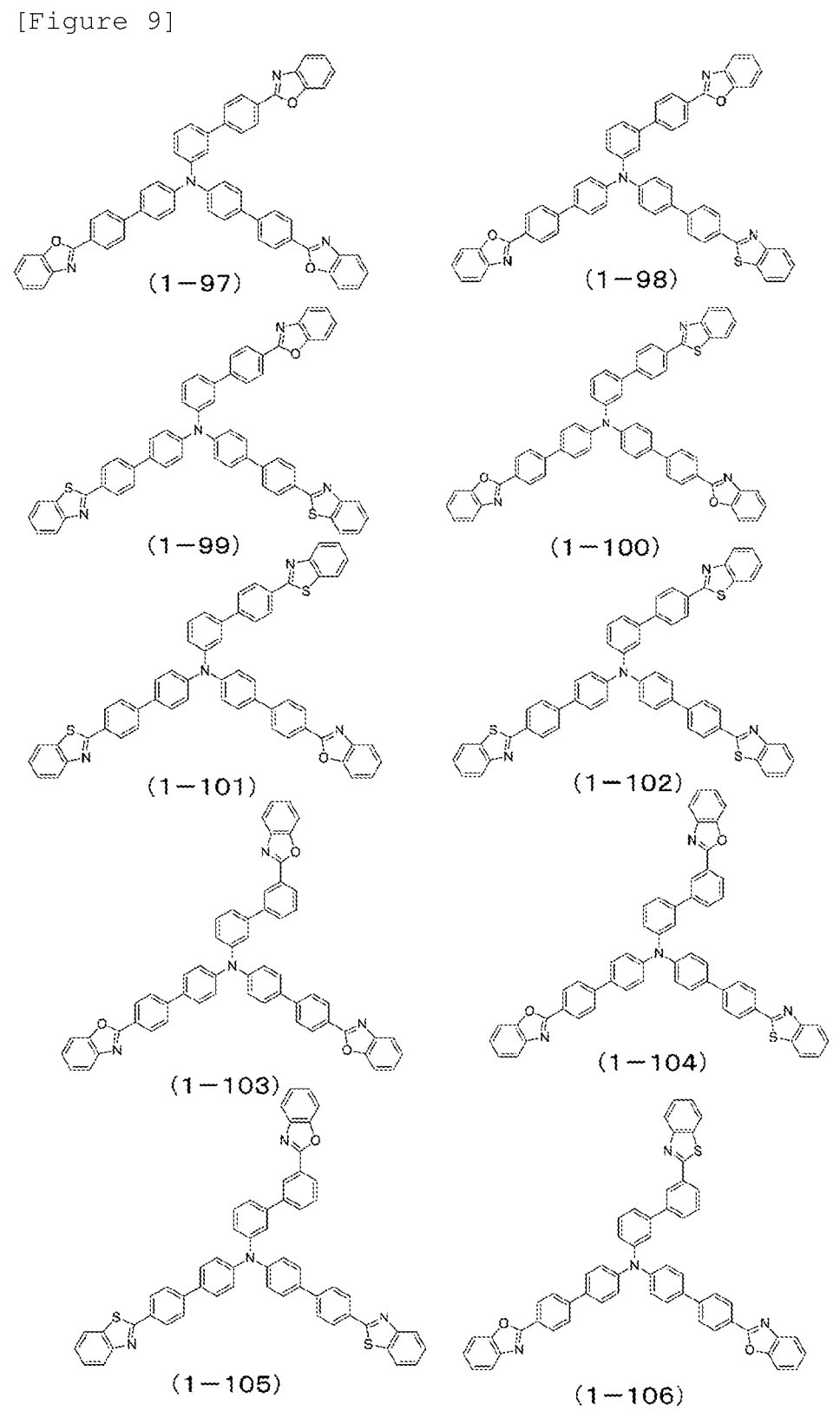

FIG. 9 is a figure showing the structures of compounds (1-97) to (1-106) as amine compounds having the benzoazole ring structure represented by the general formula (1).

FIG. 10 is a figure showing the structures of compounds (1-107) to (1-120) as amine compounds having the benzoazole ring structure represented by the general formula (1).

Figure 11:
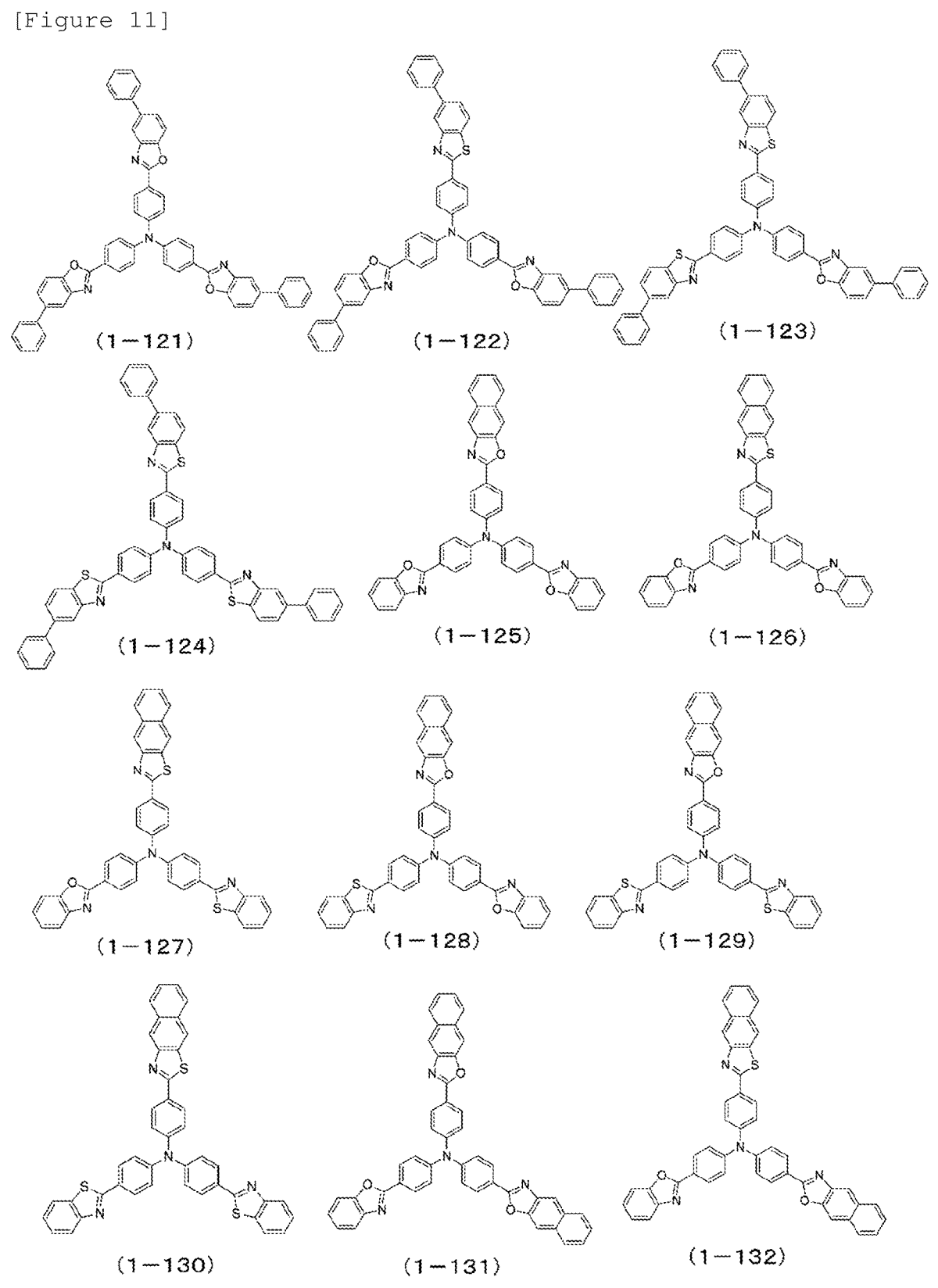

FIG. 11 is a figure showing the structures of compounds (1-121) to (1-132) as amine compounds having the benzoazole ring structure represented by the general formula (1).

Figure 12:
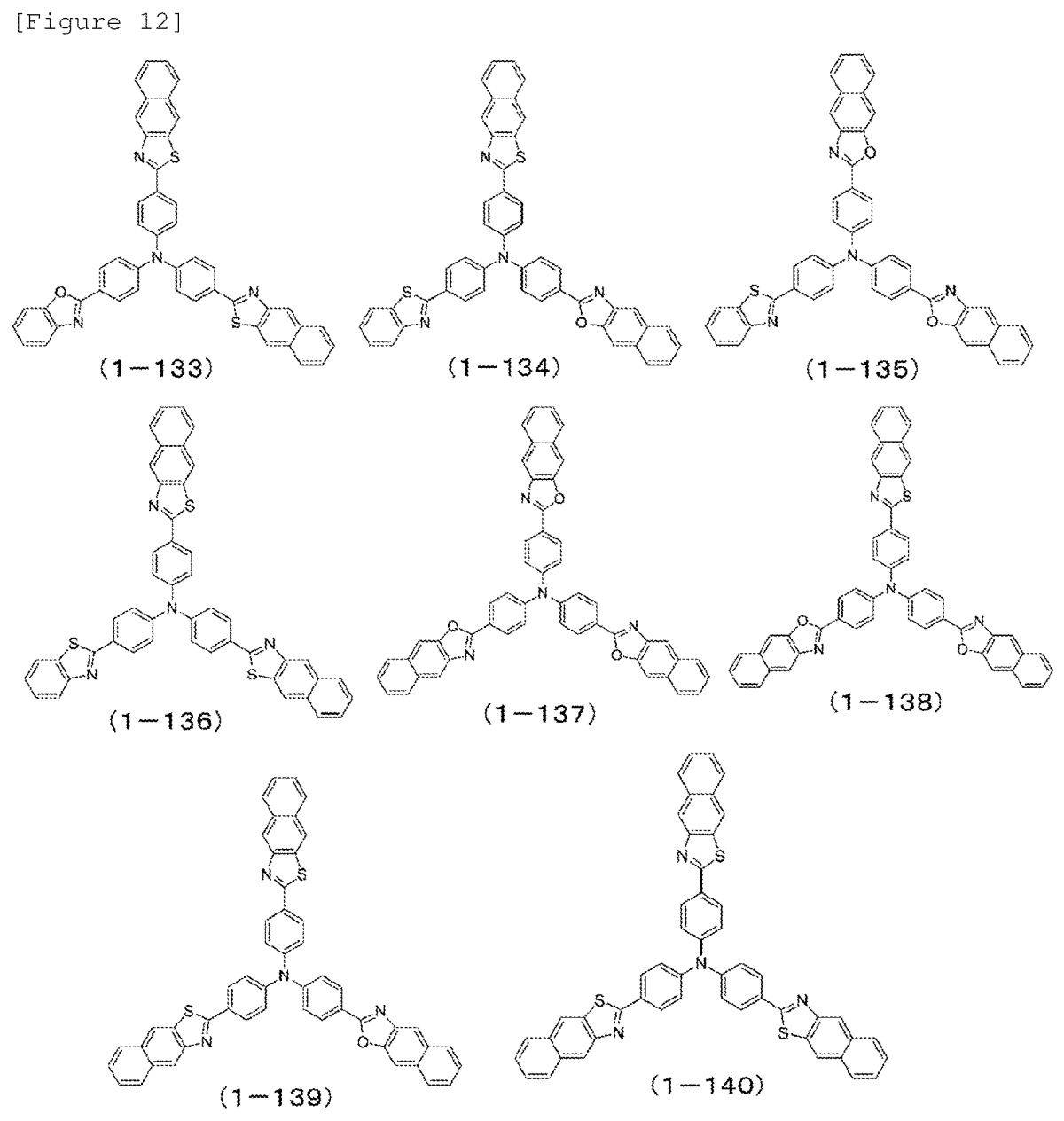

FIG. 12 is a figure showing the structures of compounds (1-133) to (1-140) as amine compounds having the benzoazole ring structure represented by the general formula (1).

FIG. 13 is a diagram illustrating the configuration of organic EL device of Examples 7 to 9 and Comparative Examples 1 to 4.

MODE FOR CARRYING OUT THE INVENTION

The amine compounds having the benzoazole ring structure represented by the general formula (1) or (1a) are novel compounds, and the benzoazole derivatives that are the main skeleton of these compounds are, for example, themselves synthesized by known methods (refer to Non-Patent Document 4, for example). Furthermore, by conducting a coupling reaction between the synthesized halogenated benzoazole derivative and an arylamine using a copper catalyst or palladium catalyst, the benzoazole amine compounds having the ring structure represented by the aforementioned general formula (1) or (1a) can be synthesized. In the same way, amine compounds having the benzoazole ring structure represented by the general formula (1) or (1a) can be synthesized by derivatizing halogenated benzoazole derivatives into boronic acid derivatives or boronic acid ester derivatives, followed by coupling reaction with halogenated arylamine (refer to non-Patent Document 5 and Non-Patent Document 6, for example).

The refractive index and extinction coefficient were measured using a spectrometer (F10-RT-UV produced by Philmetrics) for 80 nm thin film formed on a silicon substrate.

The absorbance was measured in toluene solution at a prepared concentration of $1.0 \times 10^{-5}$ mol/L, and the absorption coefficients were measured in toluene solution at prepared four concentrations of $5.0 \times 10^{-6}$ mol/L, $1.0 \times 10^{-5}$ mol/L, $1.5 \times 10^{-5}$ mol/L, and $2.5 \times 10^{-5}$ mol/L using a UV-visible-near-infrared spectrophotometer (V-650 produced by JASCO Corporation).

The specific examples of preferred compounds among the amine compounds having a benzoazole ring structure represented by the general formula (1) or (1a) preferably used in the organic EL devices of the present invention is shown in FIGS. 1 to 12. The present invention, however, is not restricted to these compounds.

The amine compounds having the benzoazole ring structure represented by the general formula (1) or (1a), which are suitably used for the organic EL devices of the present invention, are purified by column chromatography, adsorption purification using, for example, a silica gel, activated carbon, activated white clay, recrystallization or crystallization using a solvent, and finally purification by the sublimation purification method. The compounds were identified by NMR analysis. The melting point, glass transition point (Tg), refractive index and extinction coefficient, and absorbance were measured as material property values. The melting point can be used as an index of deposition properties, the glass transition point (Tg) can be used as an index of the stability in a thin film state, the refractive index and extinction coefficient can be used as an index of improved light extraction efficiency, and absorbance can be used as an index of color purity and improved light extraction efficiency.

Melting points and glass transition points (Tg) were measured by a high-sensitivity differential scanning calorimeter (DSC3100SA produced by Bruker AXS).

The organic EL device of the present invention, for example, in the case of a top emission light emitting device, may have a structure including an anode, a hole transport layer, an emission layer, an electron transport layer, a cathode, and a capping layer successively formed on a glass substrate, optionally with a hole injection layer between the anode and hole transport layer, an electron blocking layer between the hole transport layer and the light emitting layer, a hole blocking layer between the light emitting layer and an electron transport layer, and an electron injection layer between the electron transport layer and the cathode. Some of the organic layers in the multilayer structure may be omitted or may serve more than one function. For example, a single organic layer may serve as a hole injection layer and a hole transport layer, a hole transport layer and an electron blocking layer, a hole blocking layer and an electron transport layer, or an electron transport layer and an electron injection layer, and so on. Further, any of the layers may be configured to laminate two or more organic layers having the same function, and the hole transport layer may have a two-layer laminated structure, the light emitting layer may have a two-layer laminated structure, the electron transport layer may have a two-layer laminated structure, capping layer may have a two-layer laminated structure, and so on.

The total thickness of each layer of the organic EL device is preferably 200 nm to 750 nm, more preferably 350 nm to 600 nm.

The thickness of the capping layer, for example, is preferably 30 nm to 120 nm, more preferably 40 nm to 80 nm.

In this case, good light extraction efficiency can be obtained. The thickness of the capping layer can be changed according to the type of light-emitting material used in the light-emitting device, the thickness of each layer of the organic EL device other than the capping layer, and other factors.

Electrode materials with a large work function, such as ITO and gold, are used as the anode of the organic EL device.

The hole injection layer of the organic EL device of the present invention may be made of, for example, arylamine compounds having a structure in which three or more triphenylamine structures are joined within a molecule via a single bond or a divalent group that does not contain a heteroatom, for example, material such as starburst-type triphenylamine derivatives and various triphenylamine tetramers; porphyrin compounds such as copper phthalocyanine; accepting heterocyclic compounds such as hexacyanoazatriphenylene; coating-type polymer materials. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by a vapor deposition method or other known methods such as a spin coating method and an inkjet method.

The hole transport layer of the organic EL device of this invention may be made of, preferably, arylamine compounds having a structure in which two triphenylamine structures are joined within a molecule via a single bond or a divalent group that does not contain a heteroatom, such as N,N'-diphenyl-N,N'-di(m-tolyl)benzidine (TPD), N,N'-diphenyl-N,N'-di(α-naphthyl)benzidine (NPD), N,N,N',N'-tetrabiphenylylbenzidine, and 1,1-bis[4-di(4-tolylamino)phenyl] cyclohexane (TAPC). It is also preferable to use arylamine compounds having three or more triphenylamine structures in the molecule linked by a single bond or a divalent group that does not contain a heteroatom, such as various triphenylamine trimers or tetramers and the like. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. In addition, a coating-type polymer material such as poly (3,4-ethylenedioxythiophene) (PEDOT)/poly (styrene sulfonate) (PSS) may be used as the injection/transport layer of the hole. These materials may be formed into a thin film by a vapor deposition method or other known methods such as a spin coating method and an inkjet method.

The material used for the hole injection layer, or the hole transport layer may be obtained by p-doping materials such as tri sbromophenylaminehexachloroantimony, and radialene derivatives (refer to Patent Document 3, for example) into a material commonly used for these layers, or may be, for example, polymer compounds each having, as a part of the compound structure, a structure of a benzidine derivative such as TPD.

The electron-blocking layer of the organic EL device of this invention may be made of a compounds having an electron blocking effect, including, for example, carbazole derivatives such as 4,4',4"-tri(N-carbazolyl)triphenylamine (TCTA), 9,9-bis[4-(carbazol-9-yl)phenyl]fluorene, 1,3-bis (carbazol-9-yl)benzene (mCP), and 2,2-bis[4-(carbazol-9- yl)phenyl]adamantane (Ad-Cz); and compounds having a triphenylsilyl group and a triarylamine structure, as represented by 9-[4-(carbazol-9-yl)phenyl]-9-[4-(triphenylsilyl) phenyl]-9H-fluorene. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by a vapor deposition method or other known methods such as a spin coating method and an inkjet method.

The light emitting layer of the organic EL device of this invention may be made of various metal complexes of quinolinol derivatives, such as $Alq_3$, as well as various anthracene derivatives, bis(styryl)benzene derivatives, pyrene derivatives, oxazole derivatives, polyparaphenylene vinylene derivatives, etc. may be used. Further, the light emitting layer made of a host material and a dopant material. Anthracene derivatives are preferably used as the host material, but various metal complexes, bis(styryl)benzene derivatives, pyrene derivatives, oxazole derivatives, polyparaphenylene vinylene derivatives, heterocyclic compound having an indole ring as a partial structure of the fused ring, heterocyclic compound having a carbazole ring as a partial structure of fused ring, carbazole derivatives, thiazole derivatives, benzimidazole derivatives, polydialkylfluorene derivatives may be used. Further, as dopant materials, quinacridone, coumarin, rubrene, perylene and their derivatives, benzopyran derivatives, rhodamine derivatives, amino styryl derivatives may be used, and green light emitting materials are particularly preferred. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer.

Further, the light-emitting material may be a phosphorescent material. Phosphorescent materials as metal complexes of metals such as iridium and platinum may be used. Examples of the phosphorescent materials include green phosphorescent materials such as $Ir(ppy)_3$, blue phosphorescent materials such as FIrpic and FIr6, and red phosphorescent materials such as $Btp_2Ir(acac)$, and green phosphorescent materials are particularly preferred. Here, as the hole injecting and transporting host material, 4,4'-di(N-carbazolyl)biphenyl (CBP), and carbazole derivatives such as TCTA and mCP may be used. As electron transporting host materials, p-bis(triphenyl silyl)benzene (UGH2), 2, 2',2"-(1, 3,5-phenylene)-tris(1-phenyl-1H-benzimidazole) (TPBI) may be used. In this way, a high-performance organic EL device can be produced.

To avoid concentration quenching, the doping of the host material with the phosphorescent light-emitting material should preferably be made by co-evaporation in a range of 1 to 30 weight percent with respect to the whole light emitting layer.

Further, Examples of the light-emitting material may be delayed fluorescent-emitting material such as a CDCB derivative of PIC-TRZ, CC2TA, PXZ-TRZ, 4CzIPN or the like (refer to Non-Patent Document 7, for example) These materials may be formed into a thin film by using a vapor deposition method or other known methods such as a spin coating method and an inkjet method.

The hole blocking layer of the organic EL device of the present invention may be formed by using hole blocking compounds such as various rare earth complexes, triazole derivatives, triazine derivatives, and oxadiazole derivatives, in addition to the metal complexes of phenanthroline derivatives such as bathocuproin (BCP), and the metal complexes of quinolinol derivatives such as aluminum(III) bis(2-methyl-8-quinolinate)-4-phenylphenolate (BAlq). These materials may also serve as the material of the electron transport layer. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by using a vapor deposition method or other known methods such as a spin coating method and an inkjet method.

The electron transport layer of the organic EL device of the present invention may be formed by using metal complexes of quinolinol derivatives such as Alq$_3$ and BAlq, various metal complexes, triazole derivatives, triazine derivatives, pyrimidine derivatives, oxadiazole derivatives, pyridine derivatives, benzimidazole derivatives, benzoazole derivatives, thiadiazole derivatives, anthracene derivatives, carbodiimide derivatives, quinoxaline derivatives, pyridoindole derivatives, phenanthroline derivatives, and silole derivatives. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by using a vapor deposition method or other known methods such as a spin coating method and an inkjet method.

Examples of material used for the electron injection layer of the organic EL device of the present invention can be alkali metal salts such as lithium fluoride and cesium fluoride; alkaline earth metal salts such as magnesium fluoride; metal complexes of quinolinol derivatives such as lithium quinolinol; metal oxides such as aluminum oxide; and metals such as itterbium (Yb), samarium (Sm), calcium (Ca), strontium (Sr), cesium (Cs). However, the electron injection layer may be omitted in the preferred selection of the electron transport layer and the cathode.

Further, in the electron injection layer or the electron transport layer, a material obtained by further N-doping a material which is commonly used for the layer with a metal such as cecium, or the like can be used.

The cathode of the organic EL device of the present invention may be made of an electrode material with a low work function such as aluminum, or an alloy of an electrode material with an even lower work function such as a magnesium-silver alloy, magnesium calcium alloys, a magnesium-indium alloy, or an aluminum-magnesium alloy, and furthermore ITO, IZO.

The amine compound having a benzoazole ring structure represented by the above general formula (1) or (1a) are preferably used as the capping layer of the organic EL device of the present invention. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by using a vapor deposition method or other known methods such as a spin coating method and an inkjet method.

The above description refers to an organic EL device with a top emission structure, but the invention is not limited to this, and can also be applied to organic EL devices with bottom emission structures, and organic EL devices with dual emission structures that emit light from both the top and the bottom. In these cases, the electrode in the direction from which light is extracted from the light emitting device to the outside must be transparent or translucent.

The refractive index of the material comprising the capping layer is preferably greater than the refractive index of the adjacent electrode. In other words, the capping layer improves the light extraction efficiency in the organic EL device, but the effect is more effective when the reflective index at the interface between the capping layer and the material in contact with the capping layer is larger, because the effect of light interference is greater. Therefore, the refractive index of the material comprising the capping layer is preferably greater than the refractive index of the adjacent electrode, and a refractive index of 1.90 or greater is preferable, while 2.00 or higher is far preferable.

The following describes an embodiment of the present invention in more detail based on Examples. The present invention, however, is not restricted to the following Examples as long as they do not go beyond the gist of the invention.

Example 1

Synthesis of Example Compound (1-1)

Bis[4-(benzoxazol-2-yl)-phenyl]amine: 12.3 g, 2-(4-bromophenyl)benzoxazole: 9.2 g, tert-butoxy sodium: 4.4 g, toluene: 130 ml were added into a reaction vessel, and the mixture was aerated with nitrogen gas under ultrasonic irradiation for 30 minutes. Then, palladium (II) acetate: 0.1 g, tri-(tert-butyl)phosphine in 50% (w/v) toluene solution: 0.3 g were added thereto, and the mixture was stirred refluxed and stirred for overnight. After allowing to cool, dispersion washing was carried out at 80° C., and the insoluble material was filtered off, and the resulting filtrate was concentrated to obtain a crude product. The crude product was purified by recrystallizing with a mixed solvent of toluene/acetone, whereby a yellow powder of example compound (1-1): 10.0 g (yield: 54.9%) was obtained.

[Chemical Formula 5]

(1-1)

The structure of the obtained yellow powder was identified by NMR. $^1$H-NMR (CDCl$_3$) detected 24 hydrogen signals, as follows. δ (ppm)=8.25-8.21 (6H), 7.82-7.76 (3H), 7.63-7.57 (3H), 7.41-7.32 (12H).

Example 2

Synthesis of Example Compound (1-2)

Bis[4-(benzoxazol-2-yl)-phenyl]amine: 12.3 g, 2-(4-bromophenyl)benzothiazole: 9.7 g, tert-butoxy sodium: 4.4 g, toluene: 130 mL were added into a reaction vessel, and the mixture was aerated with nitrogen gas under ultrasonic irradiation for 30 minutes. Then, palladium (II) acetate: 0.1 g, tri-(tert-butyl)phosphine in 50% (w/v) toluene solution: 0.3 g were added thereto, and the mixture was refluxed and stirred for overnight. After allowing to cool, dispersion washing was carried out at 80° C., and the insoluble material was filtered off, and the resulting filtrate was concentrated to obtain a crude product. The crude product was purified by recrystallizing with a mixed solvent of toluene/acetone, whereby a yellow powder of example compound (1-2): 14.5 g (yield: 77.5%) was obtained.

[Chemical Formula 6]

(1-2)

The structure of the obtained yellow powder was identified by NMR. $^1$H-NMR (CDCl$_3$) detected 24 hydrogen signals, as follows. δ (ppm)=8.24-8.21 (4H), 8.09-8.06 (3H), 7.92-7.89 (1H), 7.80-7.77 (2H), 7.60-7.58 (2H), 7.51 (1H), 741-7.29 (11H).

Example 3

Synthesis of Example Compound (1-4)

2-(4-aminophenyl)benzothiazole: 6.0 g, 2 (4-bromophenyl)benzothiazole: 16.2 g, tert-butoxy sodium: 7.6 g, toluene: 150 mL were added into a reaction vessel, and the mixture was aerated with nitrogen gas under ultrasonic irradiation for 30 minutes. Then, tris(dibenzylideneacetone) palladium (0): 0.2 g, tri-(tert-butyl)phosphine in 50% (w/v) toluene solution: 0.2 g were added thereto, and the mixture was refluxed and stirred for overnight. After allowing to cool, dispersion washing was carried out at 80° C., and the insoluble material was filtered off, and the resulting filtrate was concentrated to obtain a crude product. The crude product was purified by recrystallizing with a mixed solvent of toluene/acetone, whereby a yellow powder of example compound (1-4): 10.2 g (yield: 59.6%) was obtained.

[Chemical Formula 7]

(1-4)

The structure of the obtained yellow powder was identified by NMR. $^1$H-NMR (CDCl$_3$) detected the following 24 hydrogen signals. δ (ppm)=8.10-8.05 (9H), 7.92-7.90 (3H), 7.54-7.48 (3H), 7.42-7.37 (3H), 7.31-7.27 (6H).

Example 4

The melting points and glass transition points (Tg) of amine compounds having a benzoazole ring structure represented by the general formula (1) or (1a) were determined using a high-sensitivity differential scanning calorimeter (DSC3100SA produced by Bruker AXS).

|  | Melting point | Glass transition point (Tg) |
| --- | --- | --- |
| Compound of Example 1 | 277° C. | 126° C. |
| Compound of Example 2 | 274° C. | 123° C. |
| Compound of Example 3 | 270° C. | 119° C. |

Amine compounds having a benzoazole ring structure represented by the general formula (1) or (1a) have a glass transition points (Tg) of 100° C. or higher, demonstrating that the compounds have a stable thin-film state.

Example 5

An 80 nm-thick vapor-deposited film was fabricated on a silicon substrate using the amine compound having a benzoazole ring structure of the general formula (1) or (1a), and the refractive index n at wavelengths of 400 nm, 410 nm, 500 nm, and 570 nm, and the extinction coefficient k at wavelengths of 400 nm and 410 nm were also measured with spectrometer (F10-RT-UV produced by Philmetrics). For comparison, comparative compounds (2-1), (2-2), (2-3), and (2-4) of the following structural formula were also measured (refer to Patent Document 4, for example). The measurement results are summarized in Table 1.

-continued

[Chemical Formula 8]

(2-1)

[Chemical Formula 10]

(2-3)

[Chemical Formula 9]

[Chemical Formula 11]

(2-2)

(2-4)

TABLE 1

| | Refractive index n (λ: 400 nm) | Refractive index n (λ: 410 nm) | Refractive index n (λ: 500 nm) | Refractive index n (λ: 570 nm) | Extinction coefficient k (λ: 400 nm) | Extinction coefficient k (λ: 410 nm) |
|---|---|---|---|---|---|---|
| Example Compound(1-1) | 2.54 | 2.59 | 2.09 | 1.97 | 0.85 | 0.56 |
| Example Compound(1-2) | 2.47 | 2.62 | 2.14 | 2.01 | 1.03 | 0.72 |
| Example Compound(1-4) | 2.09 | 2.41 | 2.19 | 2.04 | 1.16 | 1.07 |
| Comparative Compound(2-1) | 2.05 | 2.04 | 1.88 | 1.84 | 0.05 | 0.03 |
| Comparative Compound(2-2) | 2.35 | 2.27 | 1.94 | 1.88 | 0.14 | 0.06 |
| Comparative Compound(2-3) | 2.30 | 2.20 | 1.91 | 1.87 | 0.45 | 0.31 |
| Comparative Compound(2-4) | 2.37 | 2.31 | 1.87 | 1.80 | 0.32 | 0.11 |

Thus, the compounds of the present invention have a larger refractive index of 1.90 or higher at wavelength of 500 nm to 570 nm, and more than the comparative compounds (2-1), (2-2), (2-3) and (2-4). This indicates that an improvement in light extraction efficiency in organic EL device can be expected.

In addition, the extinction coefficient of the comparative compounds (2-1), (2-2), (2-3) and (2-4) at wavelengths of 400 nm to 410 nm are less than 0.5, while the compounds of the present invention have larger values of extinction coefficient. This indicates that the compound absorbs light at wavelengths between 400 nm and 410 nm of sunlight well and do not affect the material inside the device.

Example 6

A toluene solution at a concentration of $1.0 \times 10^{-5}$ mol/L using the compounds of the present invention were prepared, and the absorbance thereof at 400 nm and 410 nm was measured with a UV-visible-near-infrared spectrophotometer (V-650 produced by JASCO Corporation). For the absorption coefficient, four different concentrations, $5.0 \times 10^{-6}$ mol/L, $1.0 \times 10^{-5}$ mol/L, $1.5 \times 10^{-5}$ mol/L, and $2.0 \times 10^{-5}$ mol/L of toluene solutions were prepared, and measured using a UV-visible-near-infrared spectrophotometer (V-650 produced by JASCO Corporation), and the absorption coefficient was calculated from the calibration curve. For comparison, comparative compounds (2-1), (2-2), (2-3), and (2-4) of the above structural formula were also measured. The measurement results are summarized in Table 2.

TABLE 2

| | Peak wave-length ($\lambda$ max) | Absorbance ($\lambda$: 400 nm) | Absorbance ($\lambda$: 410 nm) | Absorption coefficient |
|---|---|---|---|---|
| Example Compound(1-1) | 386 nm | 0.75 | 0.14 | 149608 |
| Example Compound(1-2) | 387 nm | 1.11 | 0.41 | 150416 |
| Example Compound(1-4) | 396 nm | 1.55 | 1.13 | 156411 |
| Comparative compound(2-1) | 305 nm | 0.02 | 0.01 | 114814 |
| Comparative compound(2-2) | 305 nm | 0.02 | 0.00 | 98970 |
| Comparative compound(2-3) | 345 nm | 0.60 | 0.21 | 100841 |
| Comparative compound(2-4) | 373 nm | 0.28 | 0.08 | 88182 |

Thus, the absorbance at wavelengths of 400 nm to 410 nm of comparative compounds (2-1), (2-2), (2-3) and (2-4) were less than 0.7, whereas the compounds of the present invention larger than 0.7, which indicates that they absorb light at wavelengths of 400 nm to 410 nm of sunlight well. In terms of absorption coefficient, absorption coefficient of compounds of this invention is larger than that of comparative compounds (2-1), (2-2), (2-3), and (2-4). This indicates that if the concentration is the same, the compounds of the present invention show that they absorb light well, and regarding thin films, it is shown that the thicker the film thickens, the better the light absorbs and is an excellent light fastness.

Example 7

The organic EL device, as shown in FIG. 13, was fabricated by vapor-depositing a hole injection layer 3, first hole transport layer 4, second hole transport layer 5, emission layer 6, electron transport layer 7, electron injection layer 8, cathode 9, and capping layer 10 in this order on a glass substrate 1 on which a reflective ITO electrode as metal anode 2 beforehand.

Specifically, as the metal anode 2, an ITO film with a thickness of 50 mm, a silver alloy reflective film with a thickness of 100 nm, and an ITO film with a thickness of 5 nm were deposited on the glass substrate 1 in this order. After ultrasonic cleaning in isopropyl alcohol for 20 minutes, the film was dried on a hot plate heated to 250° C. for 10 minutes. After UV ozone treatment for 2 minutes, the glass substrate with ITO was installed in a vacuum vapor deposition apparatus, and the pressure was reduced to 0.001 Pa or lower. Subsequently, as the hole injection layer 3 covering the metal anode 2, an electron acceptor (Acceptor-1) of the structural formula below and compound (3-1) of the structural formula below were formed in a film thickness of 10 nm by dual vapor deposition at a vapor deposition rate ratio of Acceptor-1:compound (3-1)=3:97. The first hole transport layer 4 was formed on the hole injection layer 3 by forming the compounds (3-1) of the structural formula below in a film thickness of 70 nm. The second hole transport layer 5 was formed on the first hole transport layer 4 by forming the compound (3-2) of the structural formula below in a film thickness of 10 nm. Then, the light emitting layer 6 was formed on the second hole transport layer 5 in a film thickness of 40 nm by dual vapor deposition of the compound (3-3) of the structural formula below and Compound (3-4) of the structural formula below at a vapor deposition rate ratio of the compound (3-3):Compound (3-4)=5:95. The electron transport layer 7 was formed on the light emitting layer 6 in a film thickness of 30 nm by dual vapor deposition of the compound (3-5) of the structural formula below and Compound (3-6) of the structural formula below at a vapor deposition rate ratio of the compound (3-5):Compound (3-6)=50:50. The electron injection layer 8 was formed on the electron transport layer 7 by forming lithium fluoride in a film thickness of 1 nm. On top of the electron injection layer 8, a magnesium silver alloy was formed as the cathode 9 with a thickness of 12 nm. Finally, compound (1-1) of Example 1 was formed as the capping layer 10 with a film thickness of 60 nm. The characteristics of the organic EL device thus fabricated were measured in the atmosphere at an ordinary temperature.

Table 3 summarizes the results of emission characteristics measurements performed by applying a DC voltage to the fabricated organic EL device.

[Chemical Formula 11]

(Acceptor-1)

-continued

[Chemical Formula 13]

(3-1)

[Chemical Formula 14]

(3-2)

[Chemical Formula 15]

[Chemical Formula 16]

(3-3)

(3-4)

-continued

[Chemical Formula 17]

(3-5)

[Chemical Formula 18]

(3-6)

[Chemical Formula 19]

(1-1)

Example 8

An organic EL device was fabricated under the same conditions used in Example 7, except that the capping layer 10 was formed by forming the compound (1-2) of Example 2, instead of using the compound (1-1) of Example 1. The characteristics of the organic EL device thus fabricated were measured in the atmosphere at an ordinary temperature.

Table 3 summarizes the results of emission characteristics measurements performed by applying a DC voltage to the fabricated organic EL device.

compound (2-1) of the following structural formula, instead of using the compound (1-1) of Example 1. The characteristics of the organic EL device thus fabricated were measured in the atmosphere at an ordinary temperature.

Table 3 summarizes the results of emission characteristics measurements performed by applying a DC voltage to the fabricated organic EL device.

[Chemical Formula 20]

(1-2)

Example 9

An organic EL device was fabricated under the same conditions used in Example 7, except that the capping layer 10 was formed by forming the compound (1-4) of Example 3, instead of using the compound (1-1) of Example 1. The characteristics of the organic EL device thus fabricated were measured in the atmosphere at an ordinary temperature.

Table 3 summarizes the results of emission characteristics measurements performed by applying a DC voltage to the fabricated organic EL device.

[Chemical Formula 21]

(1-4)

Comparative Example 1

For comparison, an organic EL device was fabricated under the same conditions used in Example 7, except that the capping layer 10 was formed by forming a comparative

[Chemical Formula 22]

(2-1)

Comparative Example 2

For comparison, an organic EL device was fabricated under the same conditions used in Example 7, except that the capping layer 10 was formed by forming a comparative compound (2-2) of the following structural formula, instead of using the compound (1-1) of Example 1. The characteristics of the organic EL device thus fabricated were measured in the atmosphere at an ordinary temperature.

Table 3 summarizes the results of emission characteristics measurements performed by applying a DC voltage to the fabricated organic EL device.

[Chemical Formula 23]

(2-2)

Comparative Example 3

For comparison, an organic EL device was fabricated under the same conditions used in Example 7, except that the capping layer 10 was formed by forming a comparative compound (2-3) of the following structural formula, instead of using the compound (1-1) of Example 1. The characteristics of the organic EL device thus fabricated were measured in the atmosphere at an ordinary temperature.

Table 3 summarizes the results of emission characteristics measurements performed by applying a DC voltage to the fabricated organic EL device.

[Chemical Formula 24]

(2-3)

Comparative Example 4

For comparison, an organic EL device was fabricated under the same conditions used in Example 7, except that the capping layer 10 was formed by forming a comparative compound (2-4) of the following structural formula, instead of using the compound (1-1) of Example 1. The characteristics of the organic EL device thus fabricated were measured in the atmosphere at an ordinary temperature.

Table 3 summarizes the results of emission characteristics measurements performed by applying a DC voltage to the fabricated organic EL device.

[Chemical Formula 25]

(2-4)

Table 3 summarizes the results of the device lifetime measurements performed with the organic EL devices fabricated in Examples 7 to 9 and Comparative Examples 1 to 4. A device lifetime was measured as the time (attenuation to 95%) taken for the initial luminance to decay to 95%, with the initial brightness as 100%, when carrying out constant current drive of 10 mA/cm$^2$.

TABLE 3

| | Capping Layer | Voltage [V] (@10 mA/cm2) | Luminance [cd/m2] (@10 mA/cm2) | Current Efficiency [cd/A] (@10 mA/cm2) | Power Efficiency [lm/W] (@10 mA/cm2) | Device lifetime Attenuation to 95% |
|---|---|---|---|---|---|---|
| Example 7 | Example compound(1-1) | 4.04 | 16370 | 163.85 | 127.36 | 385 Time H |
| Example 8 | Example compound(1-2) | 4.05 | 16625 | 166.43 | 129.07 | 396 Time H |
| Example 9 | Example compound(1-4) | 4.03 | 17025 | 170.36 | 133.01 | 378 Time H |
| Comparative Example 1 | Comparative compound(2-1) | 4.02 | 13139 | 131.45 | 102.78 | 291 Time H |
| Comparative Example 2 | Comparative compound(2-2) | 4.01 | 14625 | 146.30 | 114.55 | 302 Time H |
| Comparative Example 3 | Comparative compound(2-3) | 4.06 | 13814 | 138.29 | 107.02 | 301 Time H |
| Comparative Example 4 | Comparative compound(2-4) | 4.03 | 13022 | 130.31 | 101.68 | 257 Time H |

As shown in Table 3, the driving voltage at a current density of 10 mA/cm² is almost the same for the devices in Comparative Examples 1 to 4 and Examples 7 to 9. However, luminance, current efficacy, power efficiency, and device lifetime were improved in the devices of Examples 7 to 9 compared with those of Comparative Examples 1 to 4. This indicates that the light extraction efficiency can be significantly improved by including a material with a high refractive index, which is suitably used for the organic EL devices of the present invention, in the capping layer.

INDUSTRIAL APPLICABILITY

As described above, the amine compound having the benzoazole ring structure represented by general formula (1), which is suitably used for the organic EL device of the present invention, has a high absorption coefficient of light at the wavelength range of 400 nm to 410 nm, high refractive index, which can significantly improve light extraction efficiency and stability in thin film state. The compound is excellent as a compound for organic EL device. By using this compound to fabricate organic EL devices, high efficiency can be obtained, and durability and lightfastness can be improved so that sunlight light is not absorbed and affects the materials inside the device. The use of this compound, which has no absorption in the blue, green, and red wavelength regions, makes it particularly suitable for displaying clear, bright images with good color purity. For example, it is now possible to develop applications in home appliances and lighting.

DESCRIPTION OF REFERENCE NUMERAL

1 Glass substrate
2 Metal Anode
3 Hole injection layer
4 First hole transport layer
5 Second hole transport layer
6 Light emitting layer
7 Electron transport layer
8 Electron injection layer
9 Cathode
10 Capping layer

The invention claimed is:

1. An organic electroluminescence device comprising at least an anode electrode, a hole injection layer obtained by p-doping radialene derivatives to an arylamine compound having a structure in which two triphenylamine structures are joined within a molecule via a single bond or a divalent group that does not contain a heteroatom, a first hole transport layer formed from an arylamine compound having a structure in which two triphenylamine structures are joined in a molecule via a single bond or a divalent group that does not contain a heteroatom, a second hole transport layer formed from an arylamine compound having only one triphenylamine structure in a molecule, an emission layer, an electron transport layer, a cathode electrode, and a capping layer in this order, wherein the capping layer has a refractive index of 1.90 or more higher at a wavelength of 500 nm to 570 nm and comprises an amine compound having a benzoazole ring structure represented by the following general formula (1):

(1)

wherein $R_1$ to $R_3$ may be the same or different, and represent a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and when more than one of these groups are bonded to the same benzene ring, they may be bonded to each other to form a ring, or each group may be bonded to the benzene ring to which it is bonded to form a ring, X, Y, and Z may be the same or different, and represent an oxygen atom or a sulfur atom, and $Ar_1$ to $Ar_3$ may be the same or different and represent a divalent group of a substituted or unsubstituted aromatic hydrocarbon, a divalent group of a substituted or unsubstituted aromatic heterocyclic ring, or a divalent group of substituted or unsubstituted condensed polycyclic aromatics, $r_1$ to $r_3$ may be the same or different, and represent integers from 0 to 4.

2. The organic electroluminescent device according to claim 1, wherein the amine compound having the benzoazole ring structure is represented by the following general formula (1a):

(1a)

wherein $R_1$ to $R_3$, X, Y, and Z, $r_1$ to $r_3$ represent as defined by the general formula (1).

3. The organic electroluminescent device according to claim 1, wherein all $r_1$ to $r_3$ in the general formula (1) represents 0.

4. The organic electroluminescent device according to claim 1, wherein a thickness of the capping layer is within a range of 30 nm to 120 nm.

5. A method of using an amine compound having a refractive index of 1.90 or higher at a wavelength of 500 nm to 570 nm and having a benzoazole ring structure represented by the following general formula (1) or the following general formula (1a) in a capping layer of an organic electroluminescent device comprising at least an anode electrode, a hole injection layer obtained by p-doping radialene derivatives to an arylamine compound having a structure in which two triphenylamine structures are joined within a molecule via a single bond or a divalent group that does not contain a heteroatom, a first hole transport layer formed from an arylamine compound having a structure in which two triphenylamine structures are joined in a molecule via a single bond or a divalent group that does not contain a heteroatom, a second hole transport layer formed from an arylamine compound having only one triphenylamine structure in a molecule, an emission layer, an electron transport layer, a cathode electrode and the capping layer in this order:

(1)

wherein $R_1$ to $R_3$ may be the same or different, and represent a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and when more than one of these groups are bonded to the same benzene ring, they may be bonded to each other to form a ring, or each group may be bonded to the benzene ring to which it is bonded to form a ring, X, Y, and Z may be the same or different, and represent an oxygen atom or a sulfur atom, and $Ar_1$ to $Ar_3$ may be the same or different and represent a divalent group of a substituted or unsubstituted aromatic hydrocarbon, a divalent group of a substituted or unsubstituted aromatic heterocyclic ring, or a divalent group of substituted or unsubstituted condensed polycyclic aromatics, $r_1$ to $r_3$ may be the same or different and represent integers from 0 to 4

(1a)

wherein $R_1$ to $R_3$, X, Y, and Z, $r_1$ to $r_3$ represent as defined by the general formula (1).

6. The organic electroluminescent device according to claim 2, wherein all $r_1$ to $r_3$ in the general formula (1a) represents 0.

* * * * *